US012765413B2

(12) United States Patent
Yee et al.

(10) Patent No.: US 12,765,413 B2
(45) Date of Patent: Oct. 13, 2026

(54) FAN-OUT STACKED PACKAGE AND METHODS OF MAKING THE SAME

(71) Applicant: Taiwan Semiconductor Manufacturing Co., Ltd., Hsinchu (TW)

(72) Inventors: Kuo-Chung Yee, Taoyuan City (TW); Chia-Hui Lin, Shengang Township (TW); Shih-Peng Tai, Xinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 689 days.

(21) Appl. No.: 18/152,539

(22) Filed: Jan. 10, 2023

(65) Prior Publication Data

US 2024/0096722 A1 Mar. 21, 2024

Related U.S. Application Data

(60) Provisional application No. 63/375,973, filed on Sep. 16, 2022.

(51) Int. Cl.

| | |
|---|---|
| ***H10W 72/20*** | (2026.01) |
| ***H10P 95/00*** | (2026.01) |
| ***H10W 70/60*** | (2026.01) |
| ***H10W 74/10*** | (2026.01) |
| ***H10W 90/00*** | (2026.01) |

(52) U.S. Cl.
CPC .......... *H10W 74/117* (2026.01); *H10P 95/04* (2026.01); *H10W 70/614* (2026.01); *H10W 72/20* (2026.01); *H10W 90/00* (2026.01); *H10W 90/701* (2026.01); *H10W 90/736* (2026.01)

(58) Field of Classification Search
CPC .. H01L 23/5389; H01L 24/16; H01L 25/0657
See application file for complete search history.

(56) References Cited

U.S. PATENT DOCUMENTS

2021/0028147 A1* 1/2021 Yu .......................... H01L 24/19
2024/0038702 A1* 2/2024 Uzoh ...................... H01L 24/08

FOREIGN PATENT DOCUMENTS

TW 202121641 A 6/2021
TW 202125658 A 7/2021

* cited by examiner

*Primary Examiner* — Trang Q Tran
(74) *Attorney, Agent, or Firm* — Slater Matsil, LLP

(57) ABSTRACT

In an embodiment, a package includes a first device and a second device attached to a first redistribution structure, wherein the second device includes a second redistribution structure, a first die disposed over the second redistribution structure, a first encapsulant extending along sidewalls of the first die, a first via extending through the first encapsulant, a third redistribution structure disposed over the first encapsulant and including a first metallization pattern connecting to the first via, a second die disposed over the third redistribution structure, and a second encapsulant extending along sidewalls of the second die, the first die and the second die being free of through substrate vias. The package also includes a third encapsulant disposed over the first redistribution structure and surrounding sidewalls of the first device and the second device, wherein top surfaces of the second encapsulant and the third encapsulant are level with each other.

20 Claims, 24 Drawing Sheets

FAN-OUT STACKED PACKAGE AND METHODS OF MAKING THE SAME

PRIORITY CLAIM AND CROSS-REFERENCE

This application claims the benefit of U.S. Provisional Application No. 63/375,973, filed on Sep. 16, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
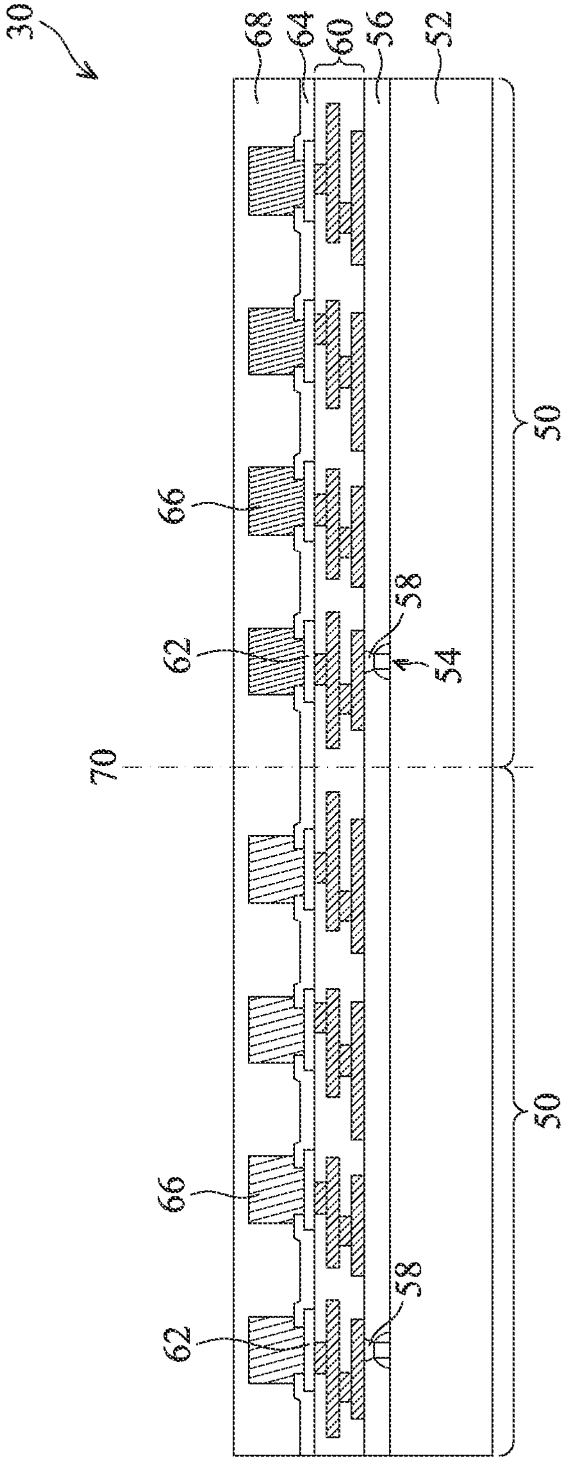
FIG. 1 is a cross-sectional view of an integrated circuit die, in accordance with some embodiments.
Figure 2:
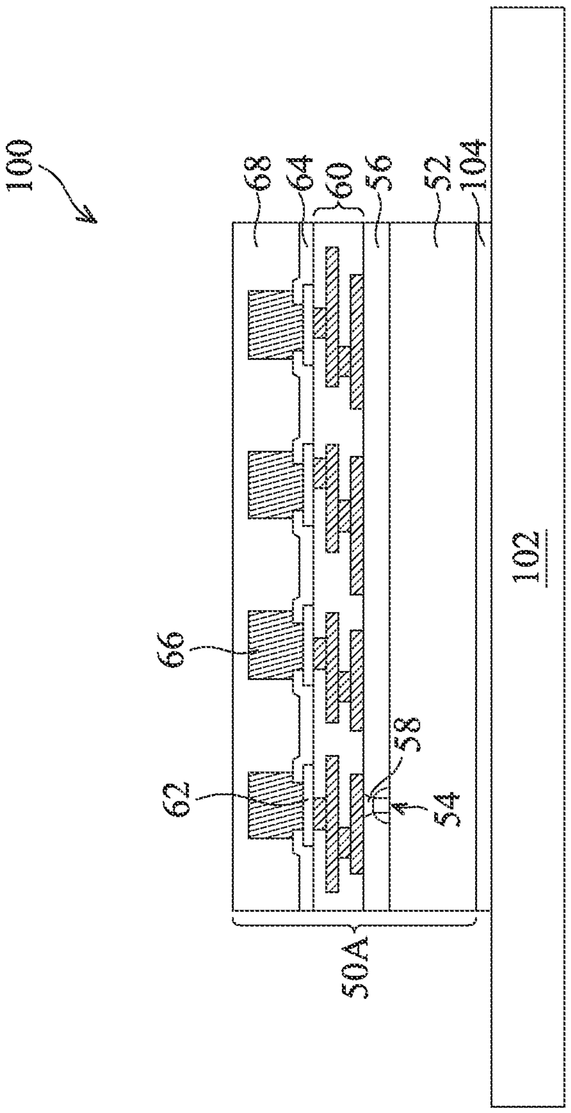
FIGS. 2-11 are cross-sectional views of intermediate stages in the manufacturing of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the embodiments will be addressed generally. In some aspects, various example embodiments may enable an extremely thin package profile integrating memory and logic chips, for example. Improved memory capacity and bandwidth may be achieved in thin-profile stacked fan-out packages. A stacked fan-out package may use through insulating vias (TIVs) as an option for electrical routing in lieu of through silicon vias (TSVs), thus reducing silicon asset penalty, reducing manufacturing costs, and increasing thermal dissipation performance. In some embodiments, the stacked fan-out package may be further integrated with other semiconductor devices, such as logic devices, for forming an integrated package that can have high performance, enhanced thermal management, and reduced manufacturing cost.

FIG. 1 illustrates a cross-sectional view of a wafer 30 including a plurality of integrated circuit dies 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, wide input/output (WIO) memory, NAND flash, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The wafer 30 may be processed according to applicable manufacturing processes to form integrated circuits in the integrated circuit dies 50. For example, each of the integrated circuit dies 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58. In some embodiments, passive devices are also formed in the interconnect structure 60.

Pads 62, such as aluminum pads, to which external connections are made. The pads 62 are on the active side of the integrated circuit dies 50, such as in and/or on the interconnect structure 60. One or more passivation films 64 are on the integrated circuit dies 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit dies 50.

Optionally, solder regions (e.g., solder balls or solder bumps) may be disposed on the pads 62. The solder balls may be used to perform chip probe (CP) testing on the integrated circuit dies 50. CP testing may be performed on the integrated circuit dies 50 to ascertain whether an individual integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit dies 50, such as on the passivation films 64 and the die connectors 66. The dielectric layer 68 laterally encapsulates the die connectors 66, and the dielectric layer 68 is laterally coterminous with the integrated circuit dies 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68. Although FIG. 1 illustrates the die connectors 66 are covered by the dielectric layer 68, the die connectors 66 may be exposed from the dielectric layer 68 by any suitable thinning or planarization process in accordance with some embodiments. In some embodiments, the dielectric layer 68 may be removed from over the die connectors 66, so that the dielectric layer 68 and/or the die connectors 66 may be used for bonding (e.g., hybrid bonding).

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during the formation of the integrated circuit dies 50. In some embodiments, the die connectors 66 remain buried and are exposed during a subsequent process for packaging the integrated circuit dies 50. Exposing the die connectors 66 may remove any solder regions that may be present on the die connectors 66. In some embodiments, after the die connectors 66 and the dielectric layer 68 are formed, the wafer 30 may be singulated according to the scribe line 70, so that the integrated circuit dies 50 may be separated and can be picked up individually.

FIGS. 2 to 10 illustrate cross-sectional views of intermediate steps in manufacturing a semiconductor device 100, in accordance with some embodiments. The semiconductor device 100 may be a device package having multiple fan-out tiers. For example, a device package comprising four fan-out tiers 101A-101D is illustrated in FIGS. 2 to 10, and more or fewer fan-out tiers may be implemented and used in other embodiments. Each of the fan-out tiers 101A-101D includes one or more device dies that are surrounded by an encapsulant. The device dies and the encapsulant may together provide a platform where a fan-out redistribution structure may be formed thereon.

FIGS. 2 to 5 illustrate intermediate steps in manufacturing a first fan-out tier 101A in accordance with some embodiments. Firstly referring to FIG. 2, one or more first device dies 50A are disposed over a carrier substrate 102, such as by a pick and place process. The one or more first device dies 50A may be attached to the carrier substrate 102 through an adhesive layer 104. The carrier substrate 102 may be a glass or ceramic carrier and may provide temporary structural support during the formation of various features of semiconductor device 100. In some embodiments, the carrier substrate 102 has a wafer shape or a panel shape. In some embodiments, the first device die 50A is the integrated circuit die 50 illustrated in FIG. 1, such as a memory die, like a DRAM die, or a logic die for controlling the memory dies. The adhesive layer 104 may be any suitable adhesive, such as epoxy, die attach film (DAF), or the like. The adhesive layer 104 may be applied to a back side of the first device die 50A, or may be applied on the surface of the carrier substrate 102. The adhesive layer 104 may have sidewalls aligned to the sidewalls of the first device die 50A.

Figure 3:
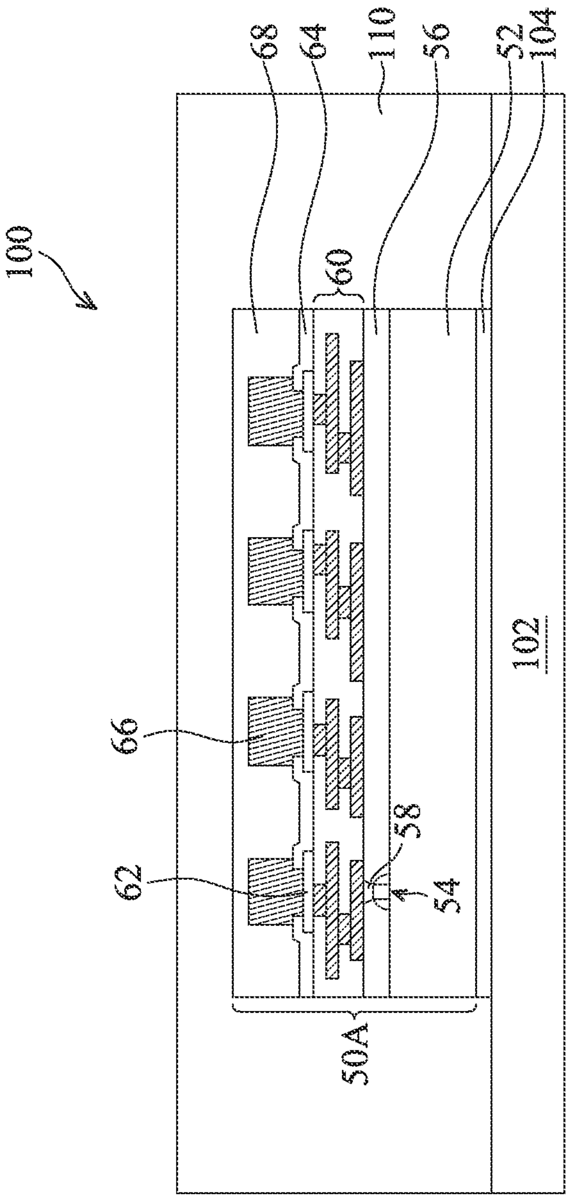

In FIG. 3, an encapsulant 110 is formed over the carrier substrate 102 in accordance with some embodiments. The encapsulant 110 may extend along sidewalls of the first device die 50A and sidewalls of the adhesive layer 104. The encapsulant 110 may cover the first device die 50A or be level with a top surface of the first device die 50A. In some embodiments, the encapsulant 110 has a shape similar to the carrier substrate 102, such as in a shape of a wafer or a panel. In some embodiments, the encapsulant 110 includes any suitable material such as an epoxy resin, a molding compound, and the like. Suitable methods for forming the encapsulant 110 may include compressive molding, transfer molding, liquid molding, and the like. For example, the encapsulant 110 may be dispensed over the carrier substrate 102 in liquid form. The filling of the encapsulant 110 may overflow the first device die 50A so that the encapsulant 110 covers the top surface of the first device die 50A. Subsequently, a curing process is performed to solidify the encapsulant 110.

Figure 4:
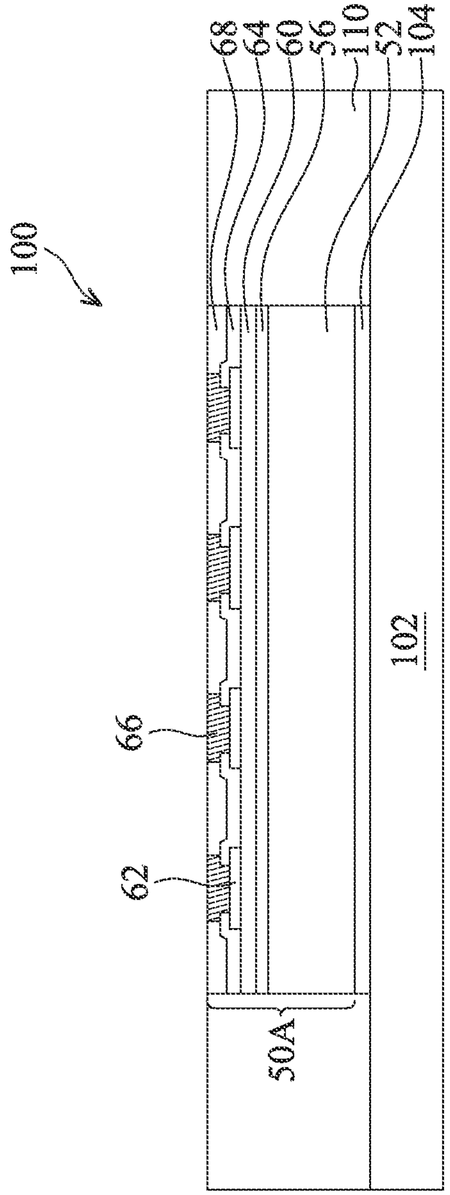

In FIG. 4, a planarizing process is performed in accordance with some embodiments. The planarizing process may include a mechanical grinding, chemical mechanical polish (CMP), or other etch back techniques, which may be employed to remove excess portions of the encapsulant 110 and expose the die connectors 66 of the first device die 50A. In some embodiments, the planarizing process also removes a portion of the die connectors 66 of the first device die 50A. After the planarizing process, top surfaces of the encapsulant 110, the die connectors 66, and the dielectric layer 68 may be substantially level. In some embodiments where more than one first device dies 50A are disposed over the carrier substrate 102, the die connectors 66 of these first device dies 50A may be substantially level with each other. After the planarization process, a planarized top surface including the top surfaces of the encapsulant 110, the die connectors 66, and the dielectric layer 68 may be formed. The planarized top surface provides a planar platform where a fan-out redistribution structure may be formed thereon.

Figure 5:
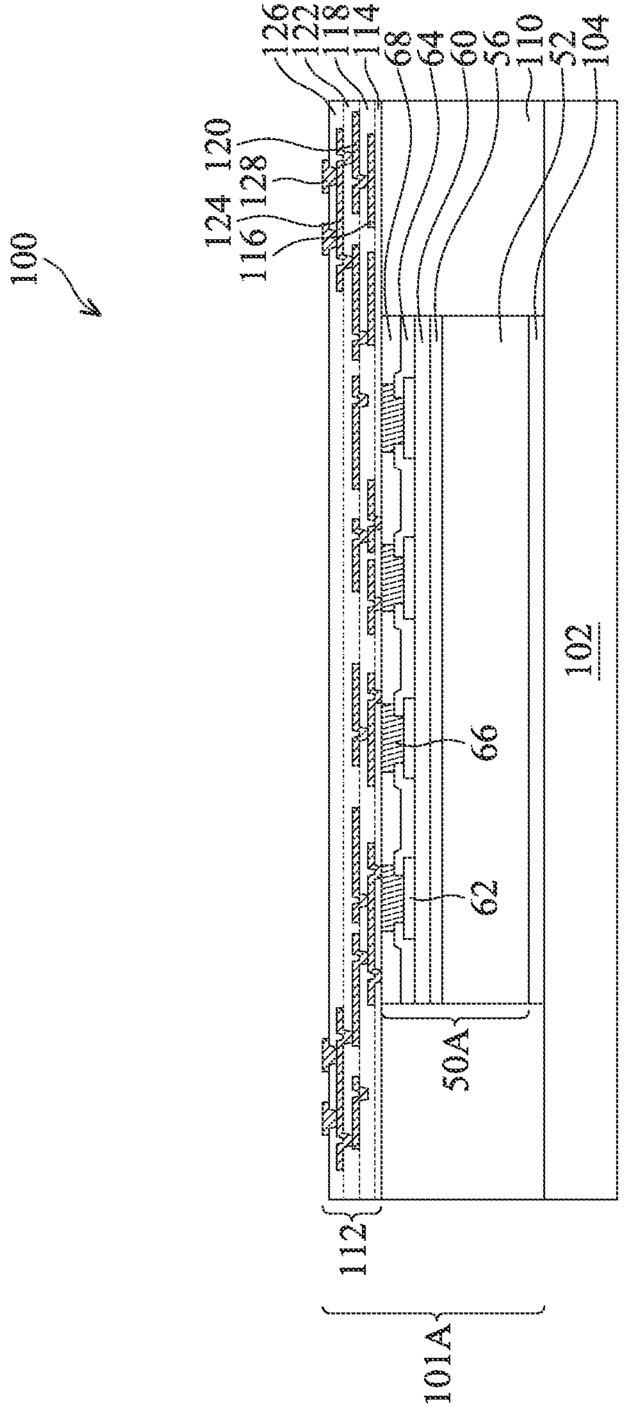

In FIG. 5, a redistribution structure 112 is formed over top surfaces of the encapsulant 110, the die connectors 66, and the dielectric layer 68 in accordance with some embodiments, thereby forming the first fan-out tier 101A. In some embodiments, the redistribution structure 112 includes dielectric layers 114, 118, 122, and 126; and metallization patterns 116, 120, 124, and 128. The metallization patterns may also be referred to as redistribution layers or redistribution lines. The redistribution structure 112 is shown as an example of having four layers of metallization patterns. More or fewer dielectric layers and metallization patterns may be formed in the redistribution structure 112. If fewer dielectric layers and metallization patterns are to be formed, steps and processes discussed below may be omitted. If more dielectric layers and metallization patterns are to be formed, steps and processes discussed below may be repeated.

The formation of the redistribution structure 112 may include depositing the dielectric layer 114 on the top surfaces of the encapsulant 110, the die connectors 66, and the dielectric layer 68. In some embodiments, the dielectric layer 114 is formed of a photosensitive material such as PBO, polyimide, BCB, or the like, which may be patterned using a lithography mask. The dielectric layer 114 may be formed by spin coating, lamination, CVD, the like, or a combination thereof. The dielectric layer 114 is then patterned. The patterning forms openings exposing portions of the die connectors 66. The patterning may be by an acceptable process, such as by exposing and developing the dielectric layer 114 to light when the dielectric layer 114 is a photosensitive material or by etching using, for example, an anisotropic etch.

The metallization pattern 116 is then formed. The metallization pattern 116 includes conductive elements extending along the major surface of the dielectric layer 114 and extending through the dielectric layer 114 to physically and electrically coupled to the first device die 50A. As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the conductive material and remaining portions of the seed layer form the metallization pattern 116.

Next, the dielectric layer 118 is deposited on the metallization pattern 116 and dielectric layer 114. The dielectric layer 118 may have a material similar to the dielectric layer 114, and may be formed in a manner similar. The metallization pattern 120 is then formed. The metallization pattern 120 includes portions on and extending along the major surface of the dielectric layer 118. The metallization pattern 120 further includes portions extending through the dielectric layer 118 to physically and electrically couple the metallization pattern 116. The metallization pattern 120 may be formed in a similar manner and of a similar material as the metallization pattern 116. In some embodiments, the dielectric layer 122 is then formed over the dielectric layer 118 and the metallization pattern 120 in a similar manner to the dielectric layer 114, and a metallization pattern 124 is formed in and over the dielectric layer 122 and electrically coupled to the metallization pattern 120 in a similar manner to the metallization pattern 116.

Next, the dielectric layer 126 is deposited on the metallization pattern 124 and dielectric layer 122. The dielectric layer 126 may have a material similar to the dielectric layer 114, and may be formed in a manner similar. The metallization pattern 128 is then formed. The metallization pattern 128 may be formed in a similar manner to the metallization pattern 116 and may include a similar material as the metallization pattern 116. The dielectric layer 126 is the topmost dielectric layer of the redistribution structure 112, and the metallization pattern 128 is the topmost metallization pattern for external connections. In some embodiments, the metallization pattern 128 has bump portions on and extending along the major surface of the dielectric layer 126, and has via portions extending through the dielectric layer 126 to physically and electrically couple the metallization pattern 124. As a result, the metallization pattern 128 is electrically coupled to the first device die 50A. The metallization pattern 128 protrudes over the dielectric layer 126 in accordance with some embodiments.

Figure 6:
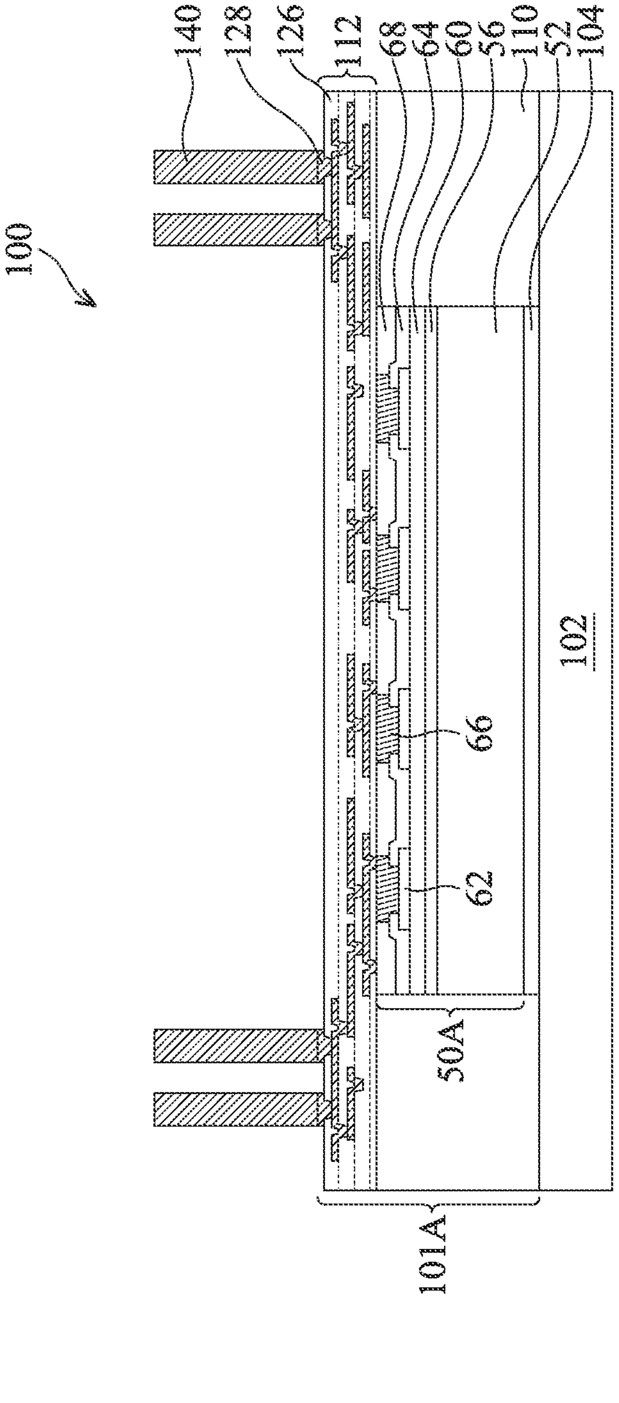
Figure 7:
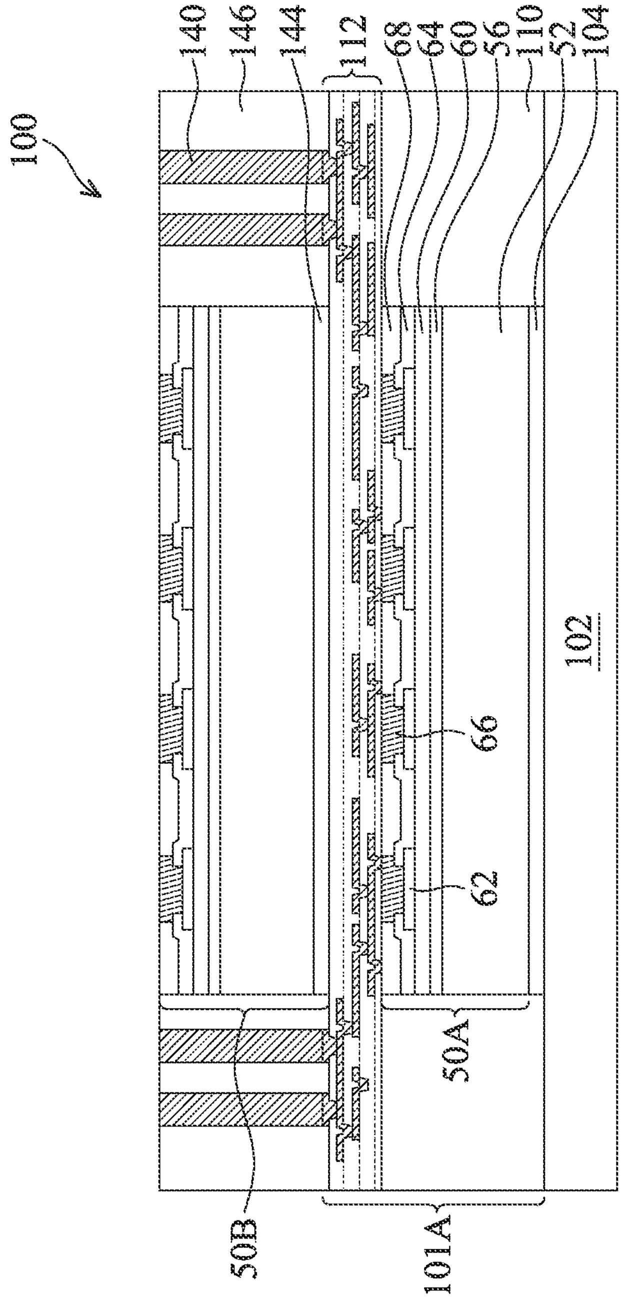
Figure 8:
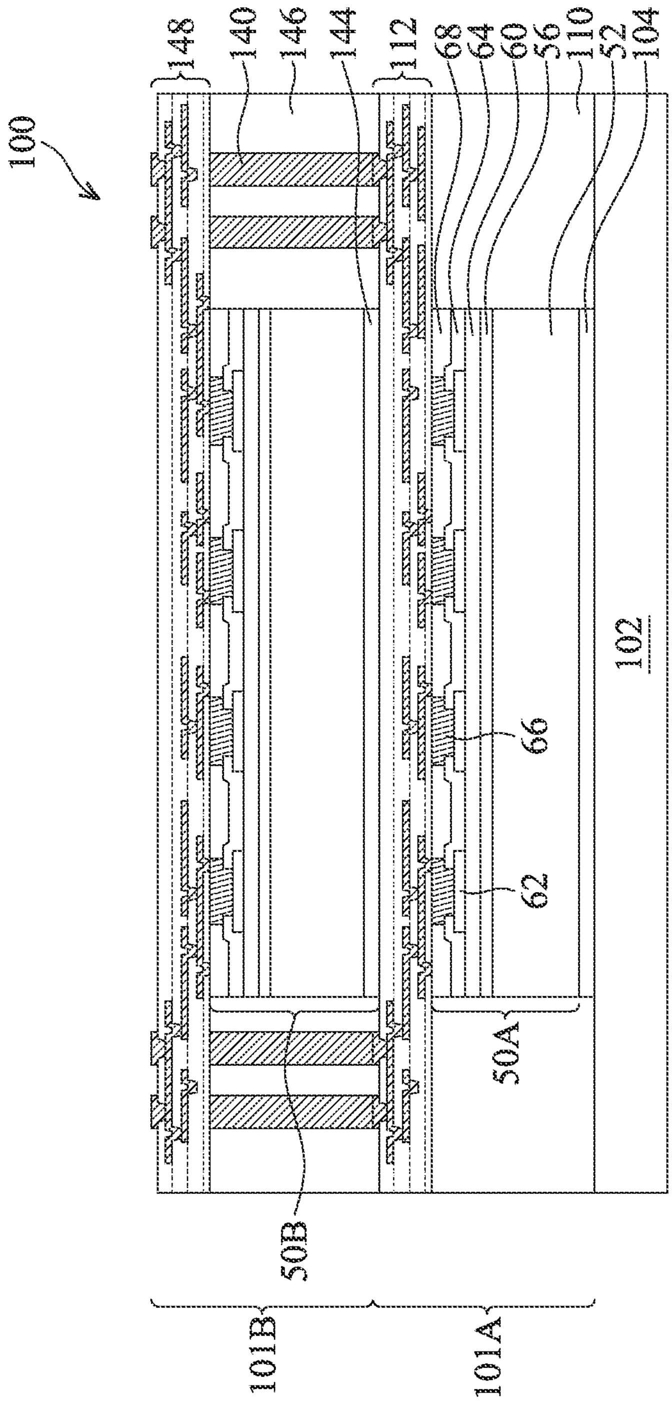

It is appreciated that the first fan-out tier 101A may be substantially free of any through via in the encapsulant 110. In some embodiments, the first fan-out tier 101A has a thickness of 30 um to 700 um. Next, FIGS. 6 to 8 illustrate cross-sectional views of intermediate steps in manufacturing a second fan-out tier 101B, in accordance with some embodiments. The second fan-out tier 101B may be disposed over the first fan-out tier 101A, such as over the redistribution structure 112.

In FIG. 6, through insulating vias (TIVs) 140 (also referred to as through-molding vias) may be formed over redistribution structure 112. The TIVs 140 extend from and are electrically coupled to the metallization pattern 128 of the redistribution structure 112. The TIVs 140 may comprise copper, for example, and may be formed by any suitable process. A patterned photoresist (not shown) having openings may be used to define the shape of the TIVs 140. For example, the patterned photoresist may include openings exposing the metallization pattern 128. The openings may then be filled with a conductive material (e.g., in an electroless plating process or electrochemical plating process). The plating process may uni-directionally fill openings (e.g., from the metallization pattern 128 upwards) in the patterned photoresist. Uni-directional filling may allow for more uniform filling of such openings, particularly for high aspect ratio TIVs. Subsequently, the photoresist may be removed in an ashing and/or wet strip process, leaving the TIVs 140 over and electrically connected to the metallization pattern 128 of the redistribution structure 112. In some embodiments, the TIVs 140 have a width (e.g., bottom width) substantially the same as the width of the metallization pattern 128 by using the metallization pattern 128 as a seed layer. In some embodiments, the widths of the TIVs 140 may be larger or smaller than the widths of the metallization pattern 128 by controlling the sizes of the openings of the patterned photoresist. In some embodiments in which the widths of the TIVs 140 are greater than the widths of the metallization pattern 128, an additional seed layer (not shown) other than the metallization pattern 128 may be deposited over the dielectric layer 126 and the metallization pattern 128 before applying the patterned photoresist. As such, the plating process may form the TIVs 140 uni-directionally from the exposed portions of the additional seed layer. The additional seed layer may be a single layer or a composite layer comprising a plurality of sub-layers formed of different materials, and may be formed by PVD or ALD. For example, the additional seed layer may include a titanium layer and a copper layer over the titanium layer. The remaining portions of the additional seed layer, not covered by TIVs 140, may be removed by a wet etch after the removal of the patterned photoresist.

In FIG. 7, one or more second device dies 50B may be disposed over the redistribution structure 112 through an adhesive layer 144 in accordance with some embodiments. In some embodiments, the second device die 50B is adjacent to and surrounded by the TIVs 140 in a plan view. The second device die 50B may be the integrated circuit die 50 as illustrated in FIG. 1. In some embodiments, the second device die 50B have a same function as the first device die 50A, such as being memory dies. Alternatively, the second device die 50B may be a memory die, and the first device die 50A is a logic die for controlling the memory die. The adhesive layer 144 may be similar to the adhesive layer 104, such as comprising a same or similar material as the adhesive layer 104.

In some embodiments, an encapsulant 146 is formed over the redistribution structure 112 and may cover the top surfaces of the second device die 50B and the TIVs 140. The encapsulant 146 may include a material similar to the encapsulant 110, and may be formed in a similar manner. The encapsulant 146 may provide structural support for the second device die 50B and the TIVs 140. A planarization process may be used for exposing the device connectors of the second device die 50B and the TIVs 140. After the planarization process, a planarized top surface including the top surfaces of the second device die 50B, the TIVs 140, and the encapsulant 146 may be formed. The planarized top surface provides a planar platform for a redistribution structure to be formed thereon. The TIVs 140 may extend through the encapsulant 146. In some embodiments, the planarization process includes mechanical grinding, CMP, or other etch back technique.

In FIG. 8, a redistribution structure 148 is formed over the top surfaces of the second device die 50B, the TIVs 140, and the encapsulant 146 in accordance with some embodiments, and the second fan-out tier 101B is formed. The redistribution structure 148 may include materials similar to those of the redistribution structure 112, which may be formed in a similar manner, although the redistribution structure 148 may have a layout different from the redistribution structure 112. The redistribution structure 148 may be electrically coupled to the redistribution structure 112 and the first device die 50A through the TIVs 140. Although FIG. 8 illustrates that the redistribution structure 148 includes four layers of dielectric layers and four layers of metallization pattern, more or fewer layers of the dielectric layers and the metallization may be implemented or used. In some embodiments, the second fan-out tier 101B has a thickness similar to that of the first fan-out tier 101A.

Figure 9:
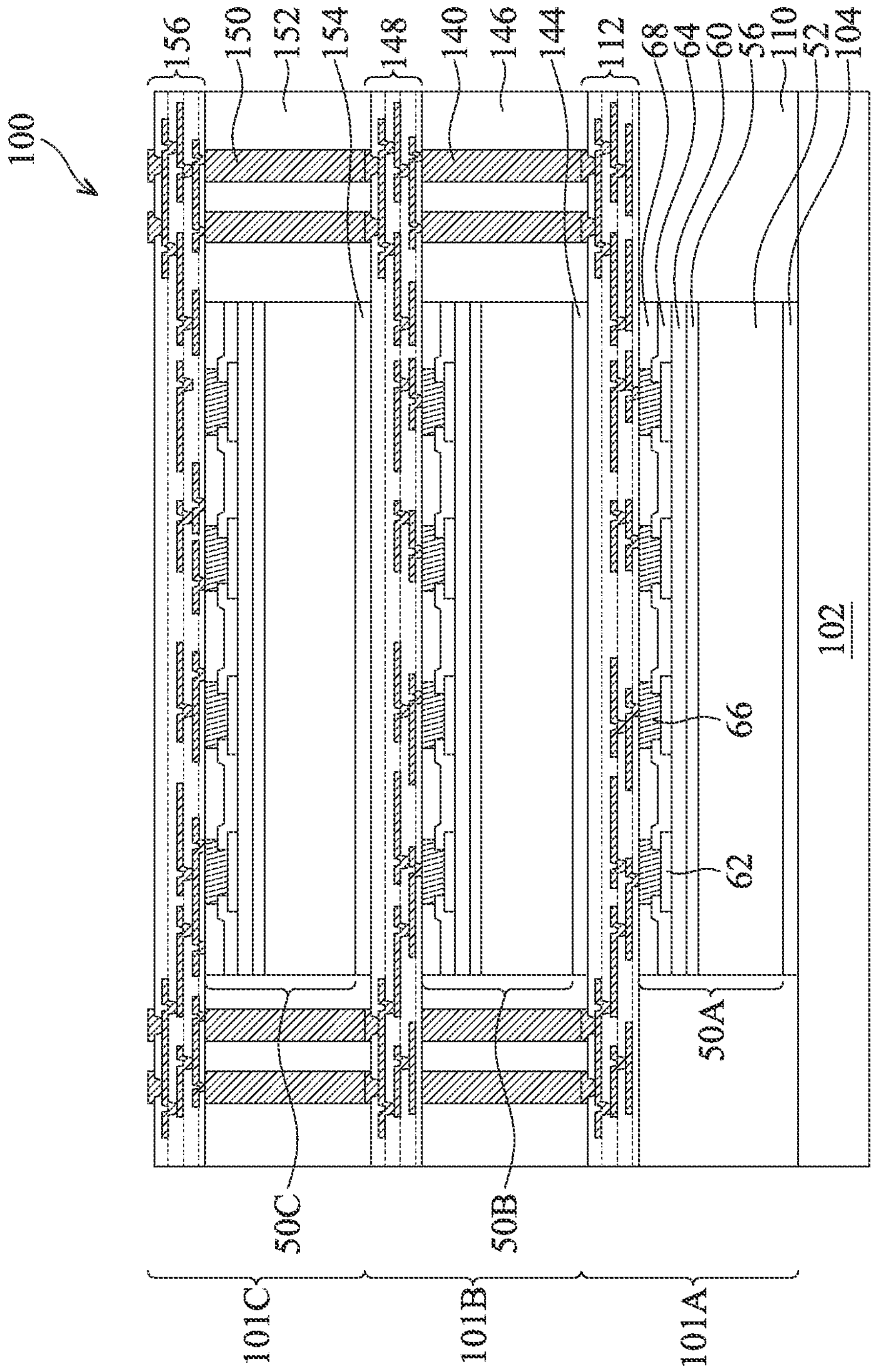

FIG. 9 illustrates forming a third fan-out tier 101C over the second fan-out tier 101B in accordance with some embodiments. The third fan-out tier 101C may be formed in a manner similar to the second fan-out tier 101B. For example, in FIG. 9, the TIVs 150 may be formed over the redistribution structure 148, such as extending from the topmost metallization pattern of the redistribution structure 148. The TIVs 150 may include a material similar to the TIVs 140, and may be formed in a similar manner. The TIVs 150 may have a width similar to a width of a top metallization pattern of the redistribution structure 148. Alternatively, the TIVs 150 may have a width greater than the width of the top metallization pattern of the redistribution structure 148. In some embodiments, the TIVs 150 may be aligned to the TIVs 140 in a plan view. In some embodiments, the TIVs 150 may be offset from the TIVs 140 in a plan view.

One or more third device dies 50C may be disposed over the redistribution structure 148 and adjacent to the TIVs 150 through an adhesive layer 154. The adhesive layer 154 may include a material similar to the adhesive layer 104. The third device die 50C may be the integrated circuit die 50 as illustrated in FIG. 1. In some embodiments, the third device die 50C may have the same function as the second device die 50B, such as being memory dies. A redistribution structure 156 may be formed over the top surfaces of the third device die 50C, the encapsulant 152, and the redistribution structure 156 in accordance with some embodiments, where the top surfaces provide a planar platform for forming the redistribution structure 156. The redistribution structure 156 may include materials similar to those of the redistribution structure 112, which may be formed in a similar manner, although the redistribution structure 156 may have a layout different from the redistribution structure 112. The metallization pattern of the redistribution structure 156 may be physically and electrically coupled to the connectors of the third device die 50C and the TIVs 150. In some embodiments, the third fan-out tier 101C has a thickness similar to that of the first fan-out tier 101A.

Figure 10:
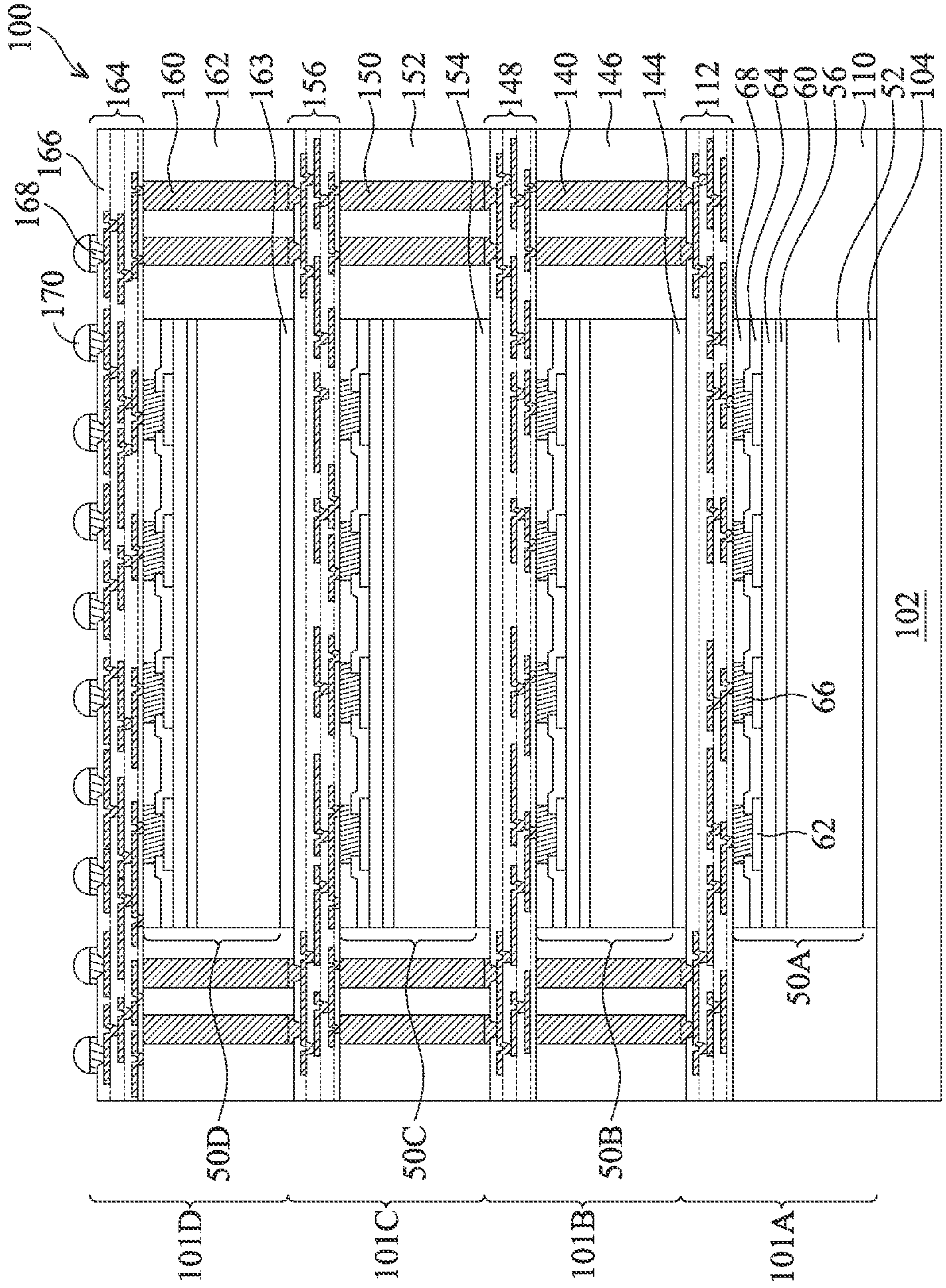

In FIG. 10, a fourth fan-out tier 101D is formed over the third fan-out tier 101C in accordance with some embodiments. The fourth fan-out tier 101D may be similar to the second fan-out tier 101B or the third fan-out tier 101C, and may be formed in a manner similar to the second fan-out tier 101B and the third fan-out tier 101C. For example, the TIVs 160 may be formed over the redistribution structure 156, such as extending from the topmost metallization pattern of the redistribution structure 156. The TIVs 160 may include a material similar to the TIVs 140, and may be formed in a similar manner. One or more fourth device dies 50D are disposed over the redistribution structure 156 through an adhesive layer 163 in accordance with some embodiments. The fourth device die 50D may be the integrated circuit die 50 as illustrated in FIG. 1. In some embodiments, the fourth device die 50D may have the same function as the first device die 50A, such as being memory dies. The adhesive layer 163 may include a material similar to the adhesive layer 144. In some embodiments, the fourth device die 50D may have the same function as the second device die 50B, such as being memory dies. The fourth device die 50D may be surrounded by the TIVs 160. The fourth device die 50D and the TIVs 160 may be surrounded by an encapsulant 162. The TIVs 160 may be extended from the topmost metallization pattern of the redistribution structure 156 and through the encapsulant 162.

A redistribution structure 164 may be formed over top surfaces of the fourth device die 50D, the encapsulant 162, and the TIVs 160 in accordance with some embodiments, where the top surfaces of the fourth device die 50D, the encapsulant 162, and the TIVs 160 provides a planar platform for the redistribution structure 164 being formed thereon. The redistribution structure 164 may include materials similar to those of the redistribution structure 112, which may be formed in a similar manner, although the redistribution structure 164 may have a layout different from the redistribution structure 112. The redistribution structure 164 may include a top dielectric layer 166 and a top metallization pattern 168. In some embodiments, the top metallization pattern 168 is referred to as under bump metallization (UBM) or contact pads. The top metallization pattern 168 may protrude over or be level with the major surface of the top dielectric layer 166. In some embodiments, the fourth fan-out tier 101D has a thickness similar to that of the first fan-out tier 101A.

Conductive connectors 170 may be disposed over the top metallization pattern 168 of the redistribution structure 164, and the redistribution structure 164 may provide electrical connection to such conductive connectors 170. The conductive connectors 170 may be ball grid array (BGA) connectors, controlled collapse chip connection (C4) bumps, micro bumps, metal pillars, electroless nickel-electroless palladium-immersion gold technique (ENEPIG) formed bumps, a combination thereof, or the like. The conductive connectors 170 may include a conductive material such as solder, copper, aluminum, gold, nickel, silver, palladium, tin, the like, or a combination thereof.

Figure 11:
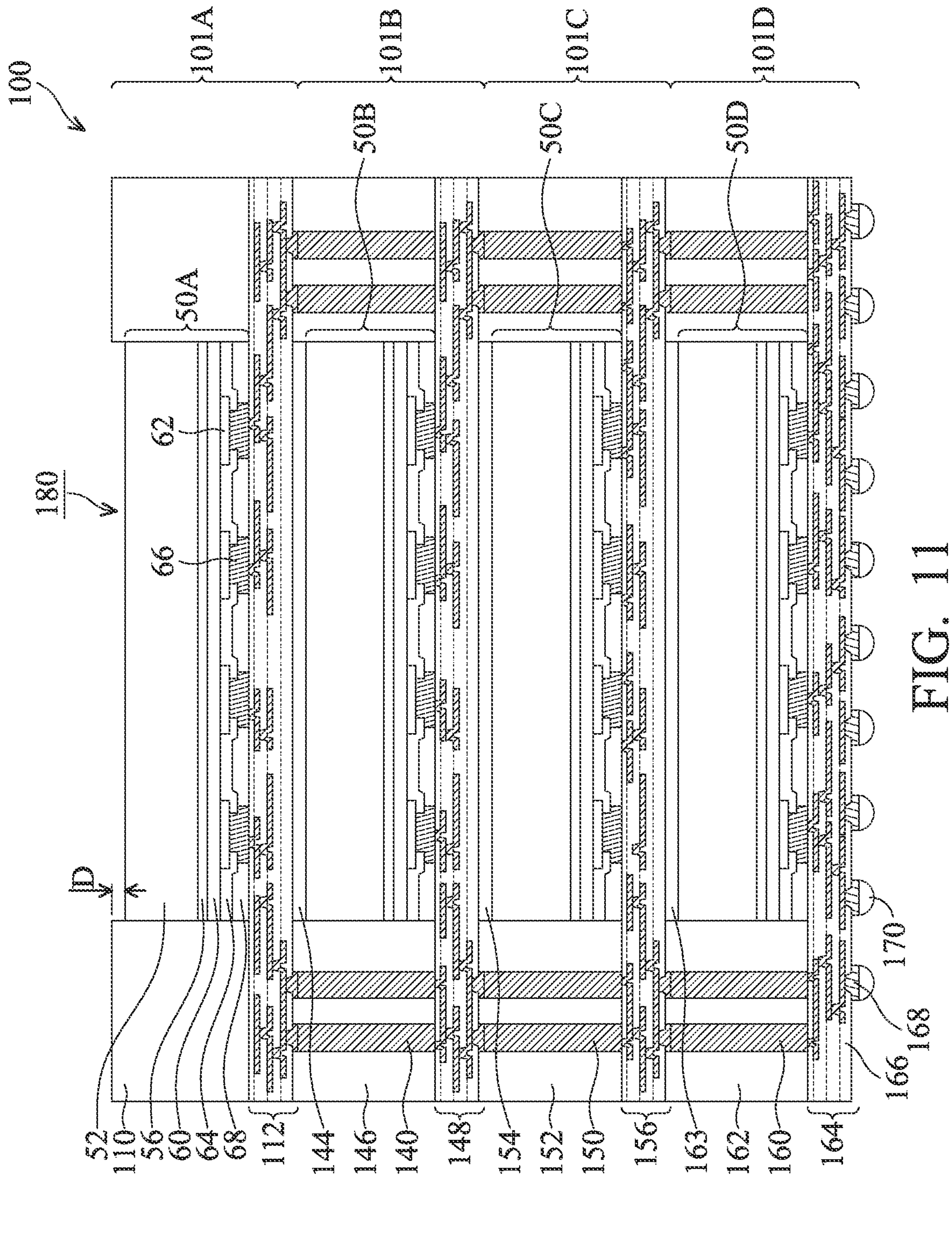

After the formation of the conductive connectors 170, a singulation process may be performed to singulate the semiconductor device 100 from adjacent semiconductor devices 100. In some embodiments, each semiconductor device 100 is an individual device package as illustrated in FIG. 11. The singulation process may include removing the carrier substrate 102 and the adhesive layer 104 before a cutting process. Due to the removal of the adhesive layer 104, a recess 180 may be formed in the encapsulant 110 and over the inactive surface of the first device die 50A. In some embodiments, the recess 180 may have a same thickness as the thickness of the adhesive layer 104. For example, the recess 180 may have a depth D, such as in a range from 5 um to 50 um.

Each of the device dies 50A-50D may communicate with each other through the TIVs 140, 150, 160 and the redistribution structures 112, 148, 156, and 164. The device dies 50A-50D may be substantially free of through substrate vias (TSVs), which may reduce the silicon asset penalty and manufacturing costs. The TIVs may also have better thermal dissipation performance because they can have a greater size than TSVs. In some embodiments, the semiconductor device 100 as illustrated in FIG. 11 may be a memory device package, where the fourth device die 50D may be a logic die for controlling the first to third device dies 50A-50C, which may be memory dies. In some embodiments, the semiconductor device 100 as illustrated in FIG. 11 may be a memory device package, where each of the first to fourth device dies 50A-50D is a memory die, and may be controlled by a device independent from the semiconductor device 100.

Figure 12:
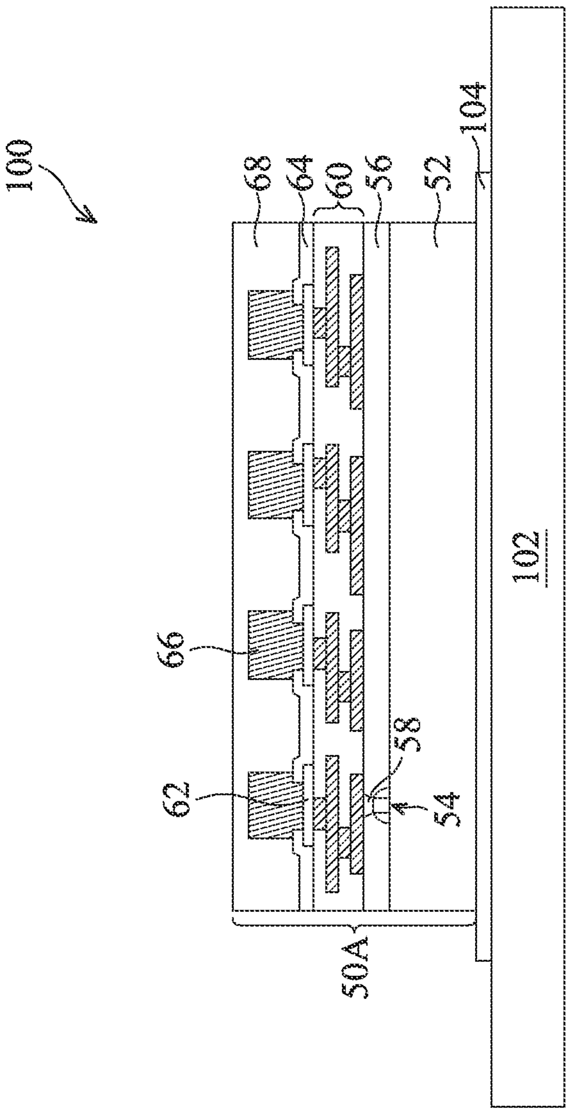
FIGS. 12-13 are cross-sectional views of intermediate stages in the manufacturing of a semiconductor device, in accordance with some embodiments.
Figure 13:
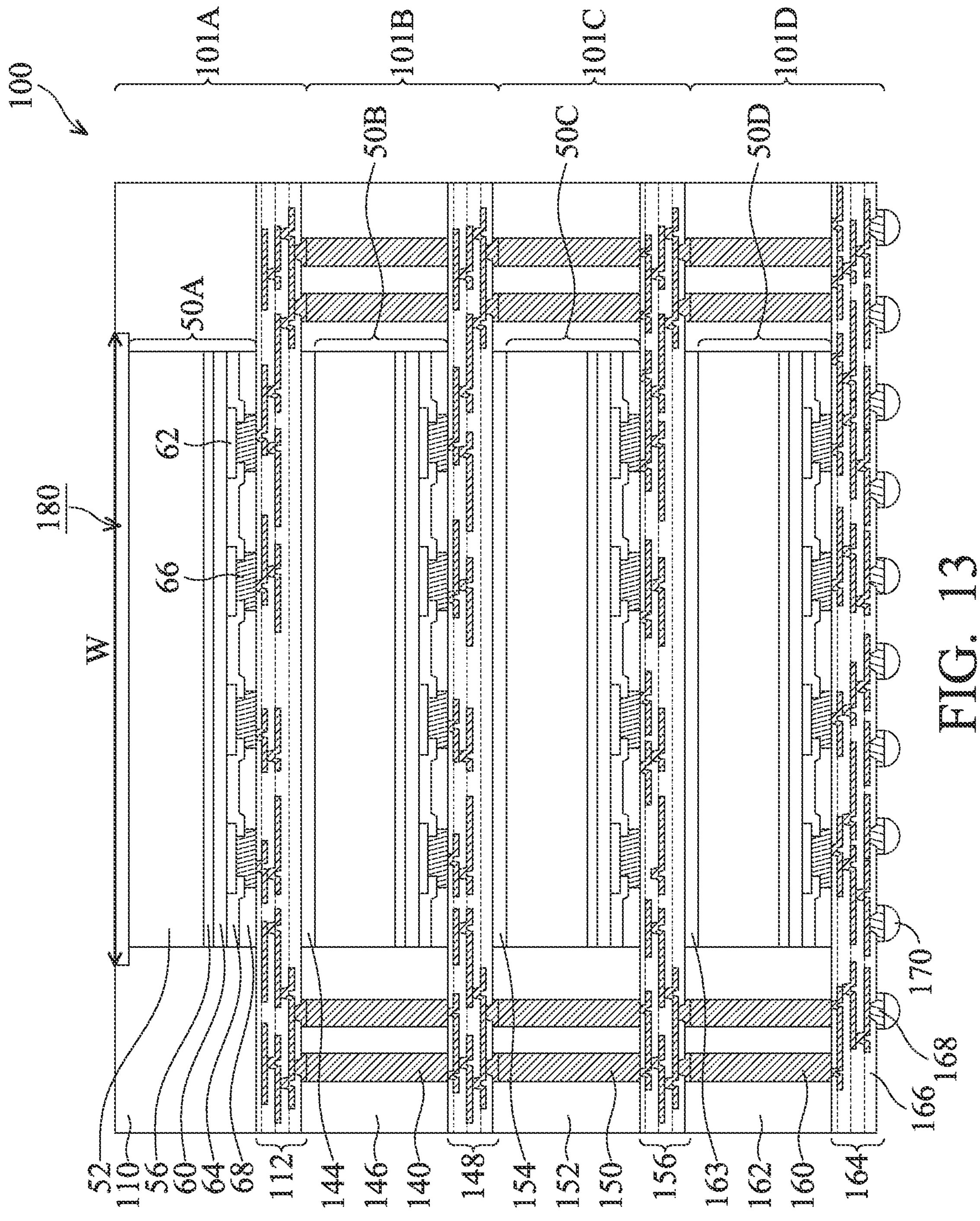

FIGS. 12 and 13 illustrate cross-sectional views of intermediate steps in the manufacturing of the semiconductor device 100 in accordance with some embodiments. The semiconductor device 100 in this embodiment is similar to that of the embodiment of FIGS. 2 to 11, except the adhesive layer 104 extends beyond sidewalls of the first device die 50A. In these embodiments, like reference numerals indicate similar elements. The adhesive layer 104 in this embodiment may be applied on the surface of the carrier substrate 102. In some embodiments, the first device die 50A and/or the carrier substrate 102 are pressed after the adhesive layer 104 is applied for achieving better adhesive performance. The adhesive layer 104 may be squeezed and extend beyond the sidewalls of the first device die 50A, as illustrated in FIG. 12.

In some embodiments, processing of manufacturing the semiconductor device 100 proceeds according to processes similar to those described for FIGS. 3 to 11, and a resulting structure is acquired, such as the semiconductor device 100 as illustrated in FIG. 13. The recess 180 of this embodiment may have a width greater than a width of the first device die 50A. For example, the recess 180 may have a width W that is in the range of 1 to 50 um, which may be 1.1 to 1.5 times the width of the first device die 50A. Although FIG. 13 only shows the adhesive layer 104 in the first fan-out tier has an enlarged width W, at least one of the adhesive layers 144, 154, and 163 in other fan-out tiers may also have an enlarged width, such as the width W.

FIGS. 14 to 18 illustrate cross-sectional views of intermediate stages in the manufacturing of an integrated package 200 in accordance with some embodiments. In some embodiments, the manufacturing of the integrated package 200 includes integrating a semiconductor device 100 with other device dies or device stacks which may serve different functions than the semiconductor device 100. For example, referring to FIG. 14, a redistribution structure 204 is formed over a carrier substrate 202. The carrier substrate 202 may be a glass or ceramic carrier and may provide temporary structural support during the formation of various features of the integrated package 200. In some embodiments, the carrier substrate 202 may have a wafer or panel shape.

Figure 14:
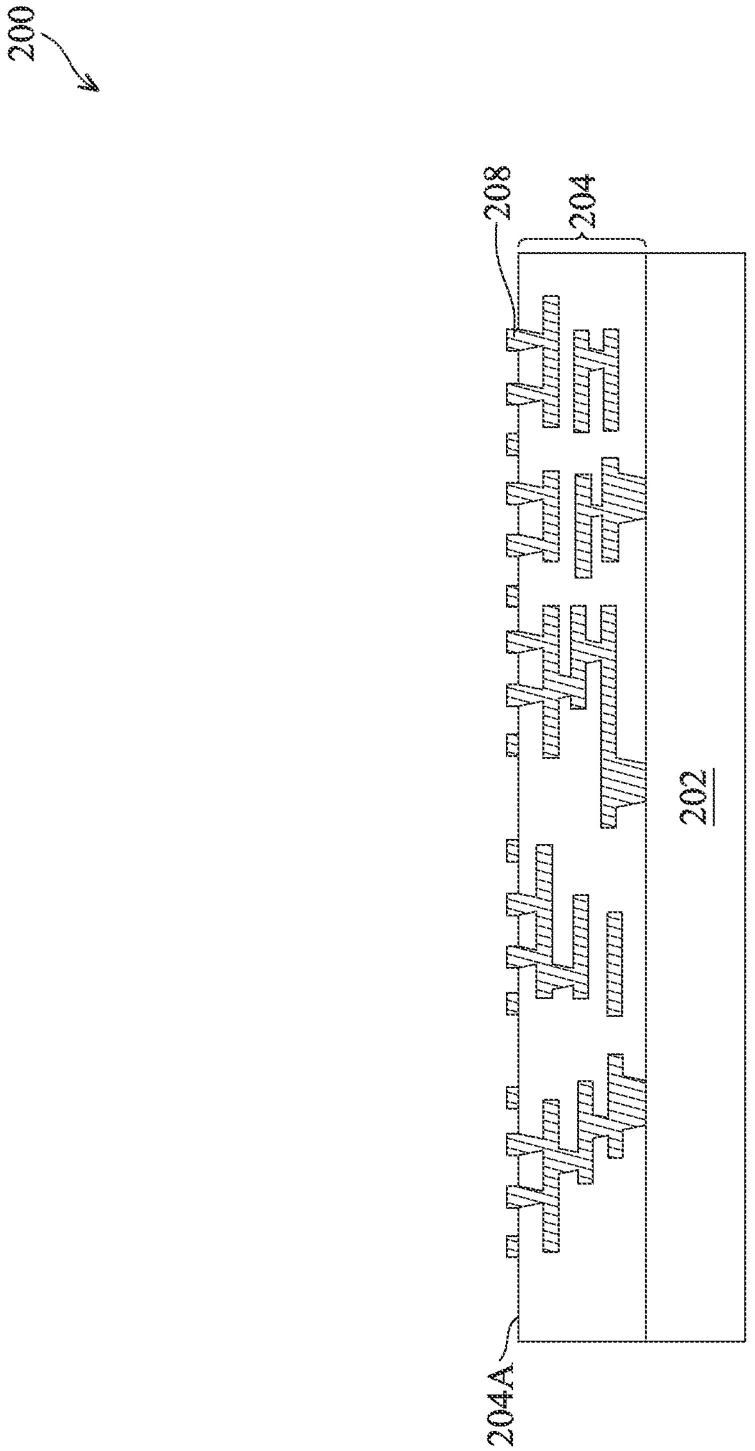
FIGS. 14-18 are cross-sectional views of intermediate stages in the manufacturing of an integrated package, in accordance with some embodiments.

The redistribution structure 204 may be formed over the carrier substrate 202. The redistribution structure 204 may be substantially similar to redistribution structure 112 both in formation process and composition, and with greater sizes of the metallization pattern and a different layout. In some embodiments, as illustrated in FIG. 14, the top metallization pattern 208 of the redistribution structure 204 may protrude over a first side 204A of the redistribution structure 204, such as over the major surface of the top dielectric layer of the redistribution structure 204. Alternatively, the top metallization pattern 208 of the redistribution structure 204 may be embedded in the top dielectric layer of the redistribution structure 204. In some embodiments, the redistribution structure 204 is substantially free of through vias (e.g., TSVs) that penetrate through all the dielectric layers 114, 118, 122, and 126 and/or a semiconductor substrate.

Figure 15:
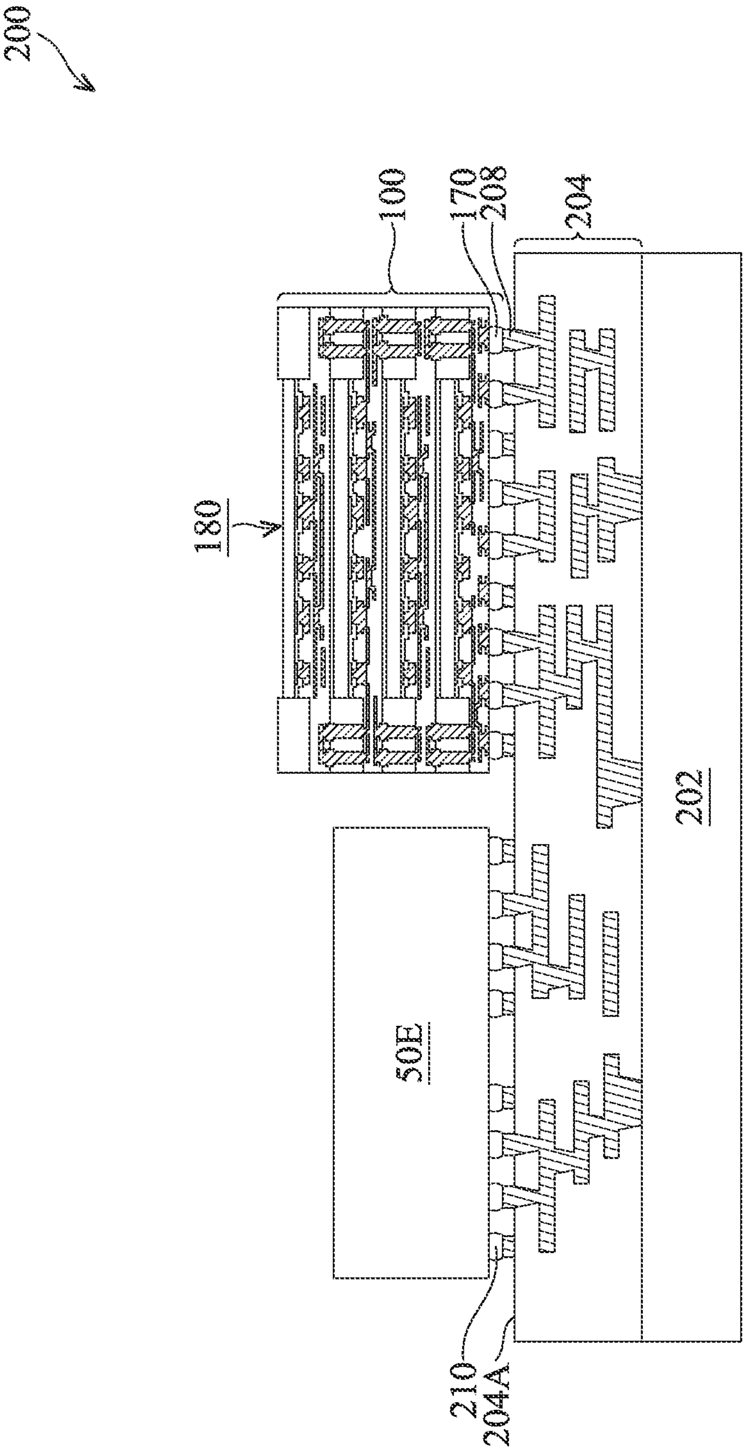

In FIG. 15, the semiconductor device 100 and one or more device dies, e.g., a device die 50E are attached to the first side 204A of the redistribution structure 204 in accordance with some embodiments. In some embodiments, the semiconductor device 100 may be bonded (e.g., flip-chip bonded) to the top metallization pattern 208 of the redistribution structure 204 through the conductive connectors 170. The device die 50E may be bonded (e.g., flip-chip bonded) to the top metallization pattern 208 through conductive connectors 210. The conductive connectors 210 may be substantially similar to the conductive connectors 170 both in formation process and composition. As such, the active surfaces of the first to fourth device dies 50A-50D (see FIGS. 11 and 13) may face the redistribution structure 204. The first to fourth devices dies 50A-50D and the devices die 50E may be electrically coupled to one another via the redistribution structure 204. In some embodiments where the fourth device die 50D may be a logic die for controlling the memory dies (e.g., the first to third device dies 50A-50C), the device die 50E may be a logic die that communicates with the fourth device die 50D, such as an application processor (AP), system on chip (SoC), and the like. In some embodiments where the first to fourth device dies 50A-50D are memory die, the device die 50E may be a logic die for controlling the first to fourth device dies 50A-50D. In some embodiments, an underfill (not shown) is disposed between the semiconductor device 100 and the redistribution structure 204 and/or between the device die 50E and the redistribution structure 204. In some embodiments, the semiconductor device 100 may have a height greater than a height of the device die 50E.

Figure 16:
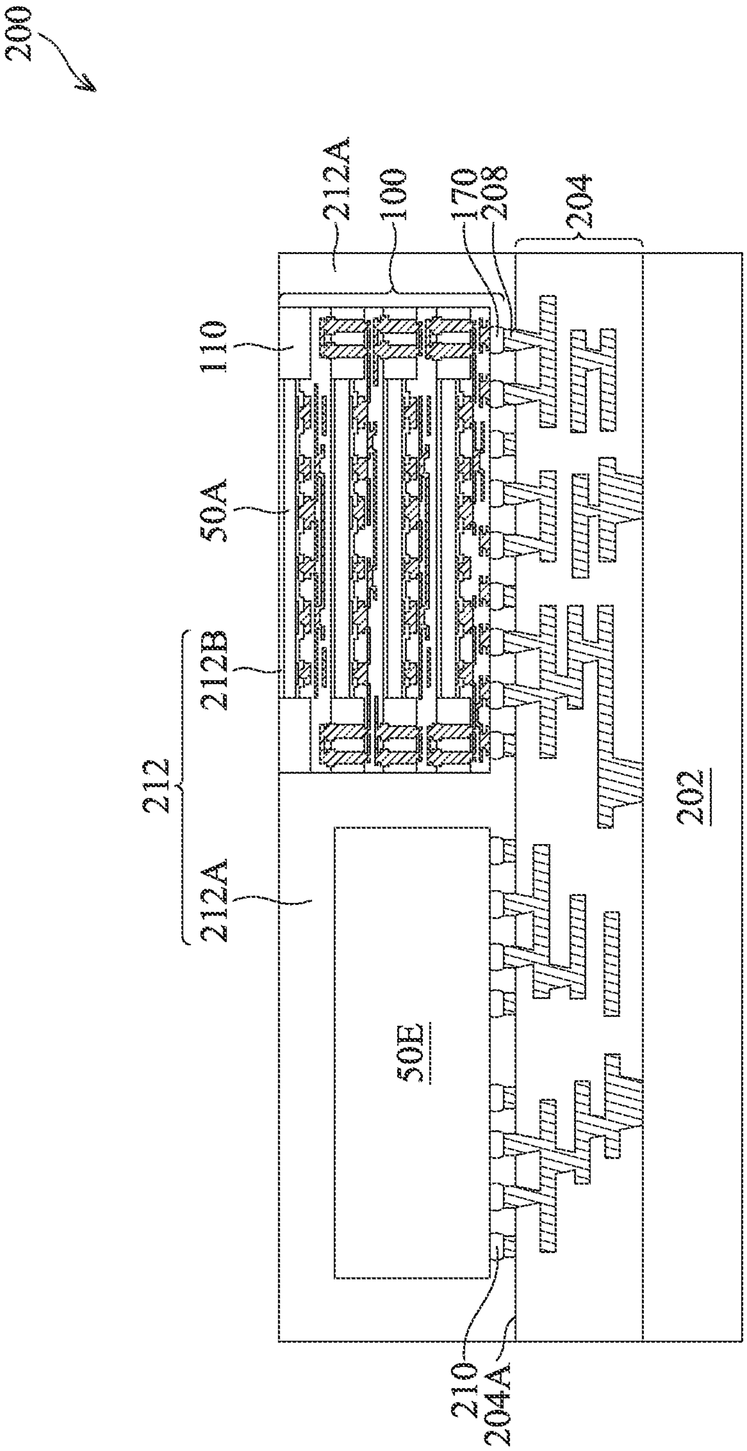

In FIG. 16, an encapsulant 212 may then be formed or applied over the redistribution structure 204 in accordance with some embodiments. The encapsulant 212 may extend along sidewalls of the semiconductor device 100 and cover the top surfaces of the semiconductor device 100 and the device die 50E. In some embodiments, the encapsulant 212 has a shape similar to the carrier substrate 102 in a plan view, such as in a shape of a wafer or a panel. In some embodiments, the encapsulant 212 includes any suitable material such as an epoxy resin, a molding compound, and the like. Suitable methods for forming the encapsulant 212 may include compressive molding, transfer molding, liquid molding, and the like. For example, the encapsulant 212 may be dispensed over the carrier substrate 202 and fill the gaps between the semiconductor device 100 and the device die 50E in liquid form. The filling of the encapsulant 212 may overflow the semiconductor device 100 and the device die 50E so that encapsulant 212 covers the top surface of the first device die 50A. Subsequently, a curing process is performed to solidify the encapsulant 212. A planarizing process is optionally performed in accordance with some embodiments. The planarizing process may include a mechanical grinding, chemical mechanical polish (CMP), or other etch back technique may be employed to remove excess portions of the encapsulant 212 and expose the semiconductor device 100.

In some embodiments, the encapsulant 212 includes a first portion 212A and a second portion 212B. The first portion 212A of the encapsulant 212 may be disposed over (e.g., in physical contact with) the redistribution structure 204 and surround the semiconductor device 100 and the device die 50E. The second portion 212B of the encapsulant 212 may fill the recess 180. The second portion 212B of the encapsulant 212 may be disposed over the inactive surface of the first device die 50A and surrounded by the encapsulant 110 in the first fan-out tier 101A. In some embodiments, the second portion 212B of the encapsulant 212 has a thickness and width same as the depth and width as the recess 180 (see FIGS. 11 and 13). In some embodiments, the first portion 212A of the encapsulant 212 and the second portion 212B of the encapsulant 212 are separated from one another. The encapsulant 212 may provide structural support for the semiconductor device 100, the device die 50E, and the redistribution structure 204.

Figure 17:
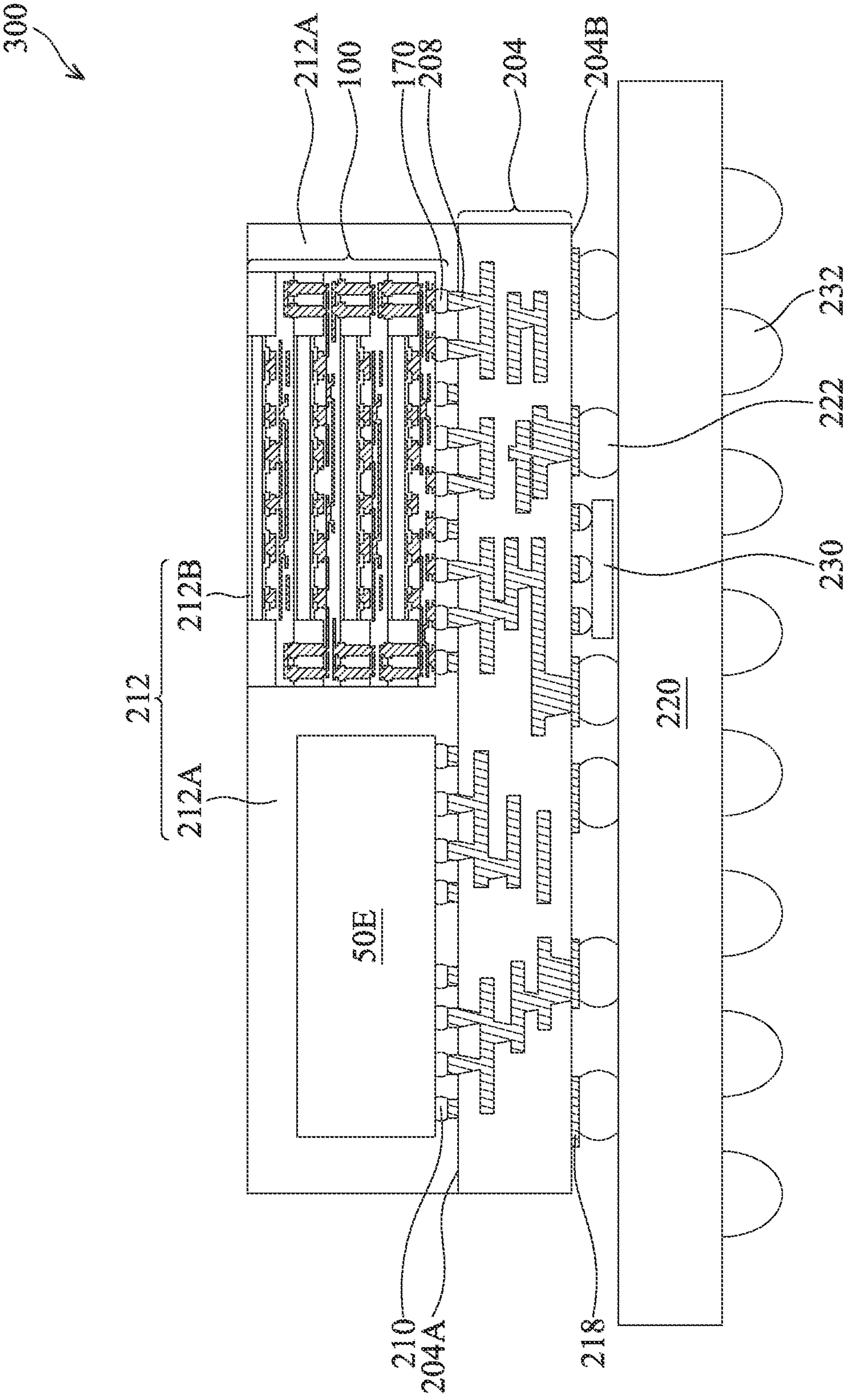

In FIG. 17, a package component 220 may be attached to a second side 204B of the redistribution structure 204 opposite to the semiconductor device 100 in accordance with some embodiments. For example, the carrier substrate 202 may be removed, and under bump metallurgies (UBM) 218 may be formed over the second side 204B of the redistribution structure 204. Conductive connectors 222 may be formed over the UBM. The UBM may include one or more layers, such as including a copper layer, a nickel layer, a titanium layer, a chromium layer, or a combination thereof. The conductive connectors 222 may be ball grid array (BGA) connectors, controlled collapse chip connection (C4) bumps, micro bumps, metal pillars, electroless nickel-electroless palladium-immersion gold technique (ENEPIG) formed bumps, a combination thereof, or the like. The conductive connectors 222 may include a conductive material such as solder, copper, aluminum, gold, nickel, silver, palladium, tin, the like, or a combination thereof. In some embodiments, the conductive connectors 222 have a greater size than that of the conductive connectors 170.

In some embodiments, a passive device 230 is attached to a second side of the redistribution structure 204 and between the conductive connectors 222. The passive device 230 may be bonded to the bottom metallization pattern of the redistribution structure 204. The passive device 230 may be an integrated passive device, which may include capacitors, inductors, and/or resistors. In some embodiments, the passive device 230 includes a capacitor that is electrically coupled to the semiconductor device 100 and the device die 50E. The passive device 230 may enhance the performance of the integrated package 200, though it may be omitted. A singulation process may be performed to singulate the integrated package 200 from adjacent integrated packages 200.

The package component 220 may then be attached to a second side 204B of the redistribution structure 204 of the integrated package 200 (after singulation) through the conductive connectors 222. The package component 220 may include other device dies, interposers, package substrates, printed circuit boards, a mother board, and the like. In some embodiments, conductive connectors 232 may be disposed over a side of the package component 220 opposite to the redistribution structure 204. The package component 220 may be further attached to the other package components (not shown), such as package substrates, printed circuit boards, a mother board, and the like. In some embodiments, the conductive connectors 232 may include a material similar to the conductive connectors 222, except with greater sizes.

Figure 18:
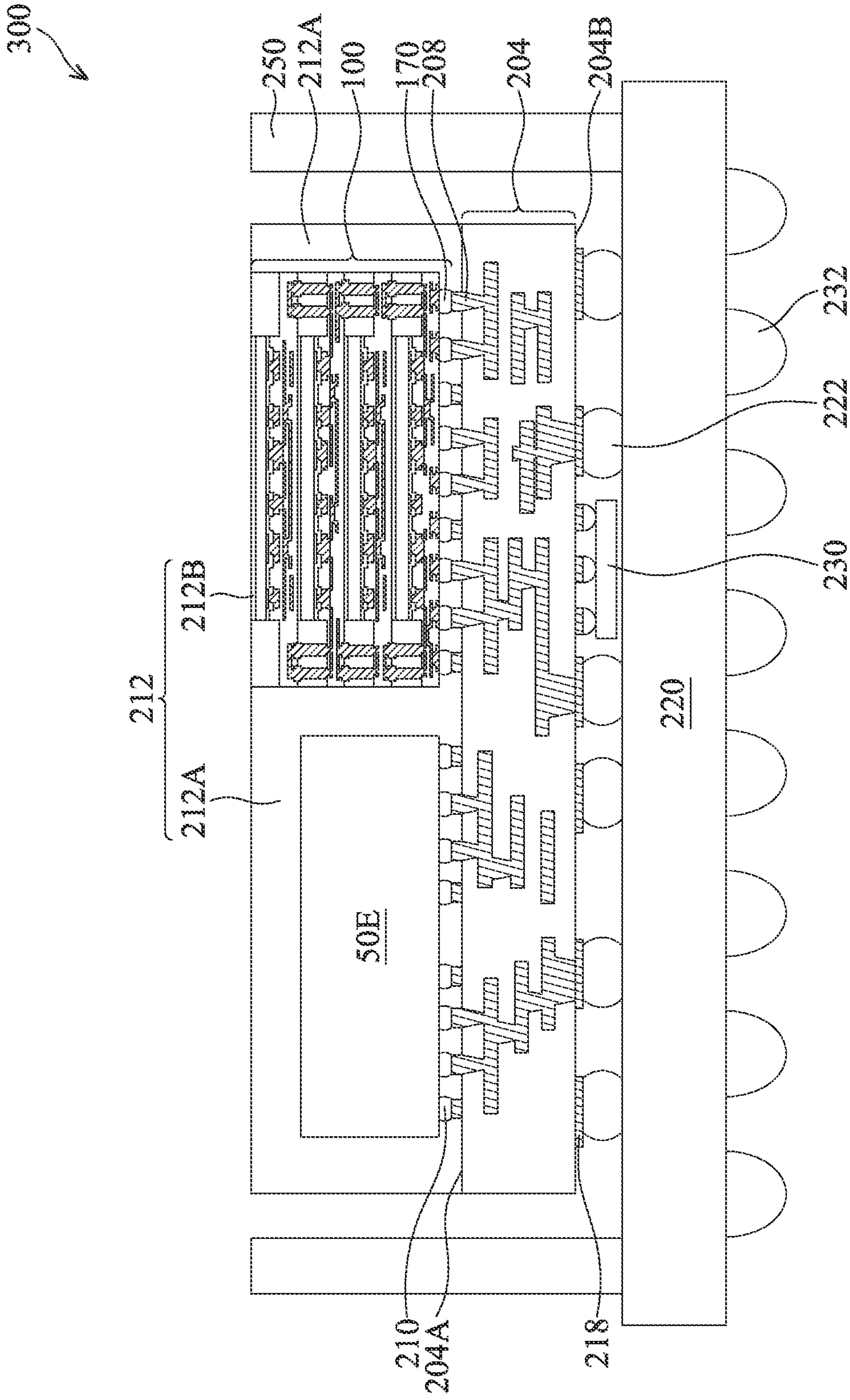

In FIG. 18, a heat dissipation structure 250 may be disposed over the package component 220. The heat dissipation structure 250 may have a ring structure that surrounds the semiconductor device 100, the device die 50E, the redistribution structure 204, and the encapsulant 212 in a plan view. The heat dissipation structure 250 may have a high thermal conductivity, for example, between about 200 W/m·K to about 400 W/m·K or more, and may be formed using a metal (e.g., Cu, Ag, Ti, Al, Fe, or an alloy thereof), graphite, carbon nanotubes (CNT), and the like. The heat dissipation structure 250 may also provide mechanical support for reducing the warpage of the package components 220.

Figure 19:
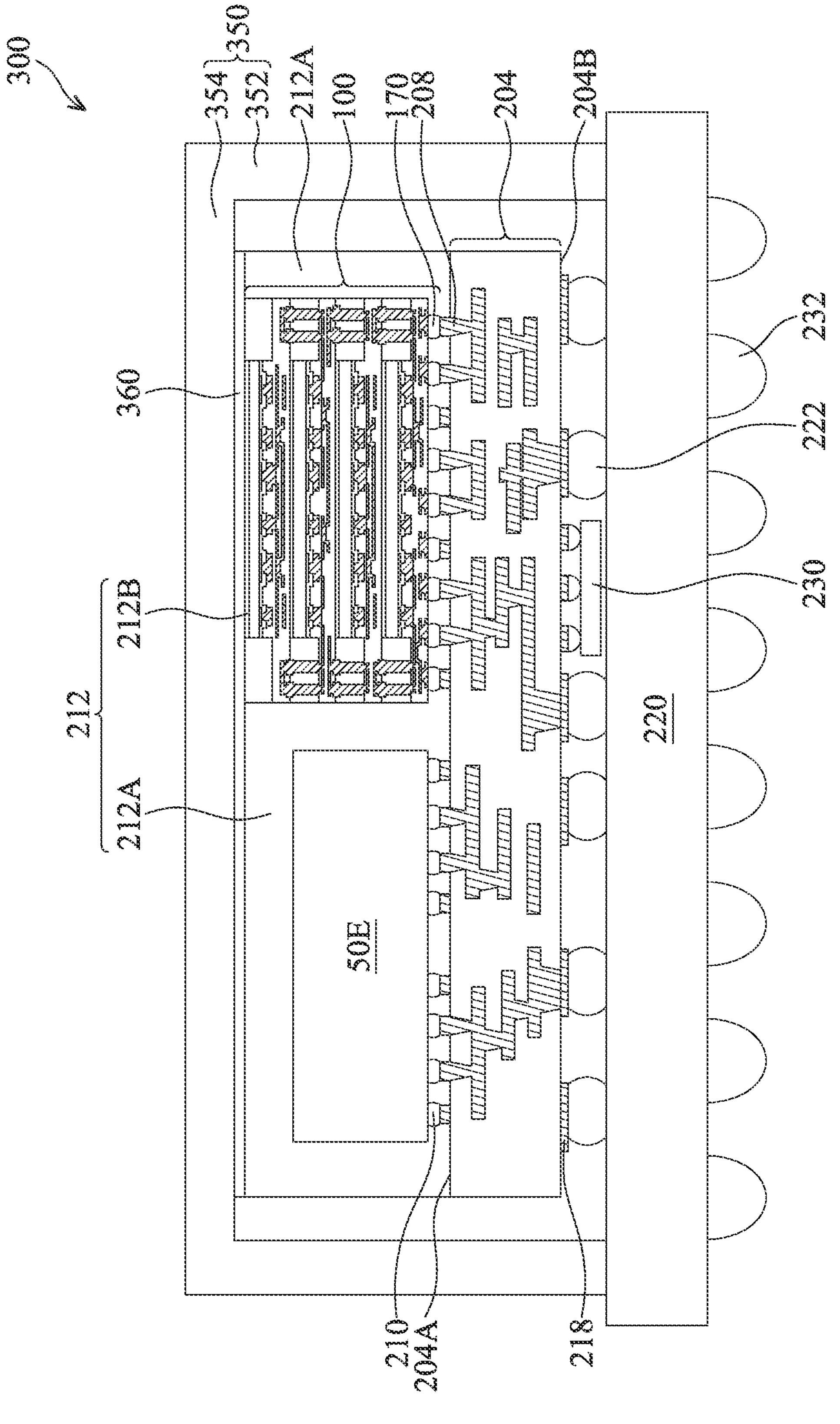
FIG. 19 is a cross-sectional view of an integrated package, in accordance with some embodiments.

In FIG. 19, a cross-sectional view of an integrated package 300 is illustrated in accordance with some embodiments. The integrated package 300 may be similar to the integrated package 200 of FIG. 18, except the integrated package 300 includes a heat dissipation structure 350 disposed over the package component 220 (in lieu of the heat dissipation structure 250). The heat dissipation structure 350 may include a ring structure 352 and a lid 354. In some embodiments, the lid 354 and the ring structure 352 are an integrated structure. In some embodiments, the lid 354 and the ring structure 352 are separate structures that are attached to each other through an adhesive layer (not shown). As illustrated in FIG. 19, the lid 354 of the heat dissipation structure 350 may be attached to the encapsulant 212 through a thermal dissipating material, such as a thermal interface material (TIM) 360. The TIM 360 may comprise, for example, a polymer having a good thermal conductivity, which may be between about 3 watts per meter kelvin (W/m·K) to about 5 W/m·K or more. The heat dissipation structure 350 may have a high thermal conductivity, for example, between about 200 W/m·K to about 400 W/m·K or more, and may be formed using a metal (e.g., Cu, Ag, Ti, Al, Fe, or an alloy thereof), graphite, carbon nanotubes (CNT), and the like. In some embodiments, the TIM 360 is in physical contact with the encapsulant 110 of the semiconductor device 100, the first portion 212A of the encapsulant 212, and the second portion 212B of the encapsulant 212. The heat dissipation structure 350 may also provide mechanical support for helping reduce the warpage of the package components 220.

Figure 20:
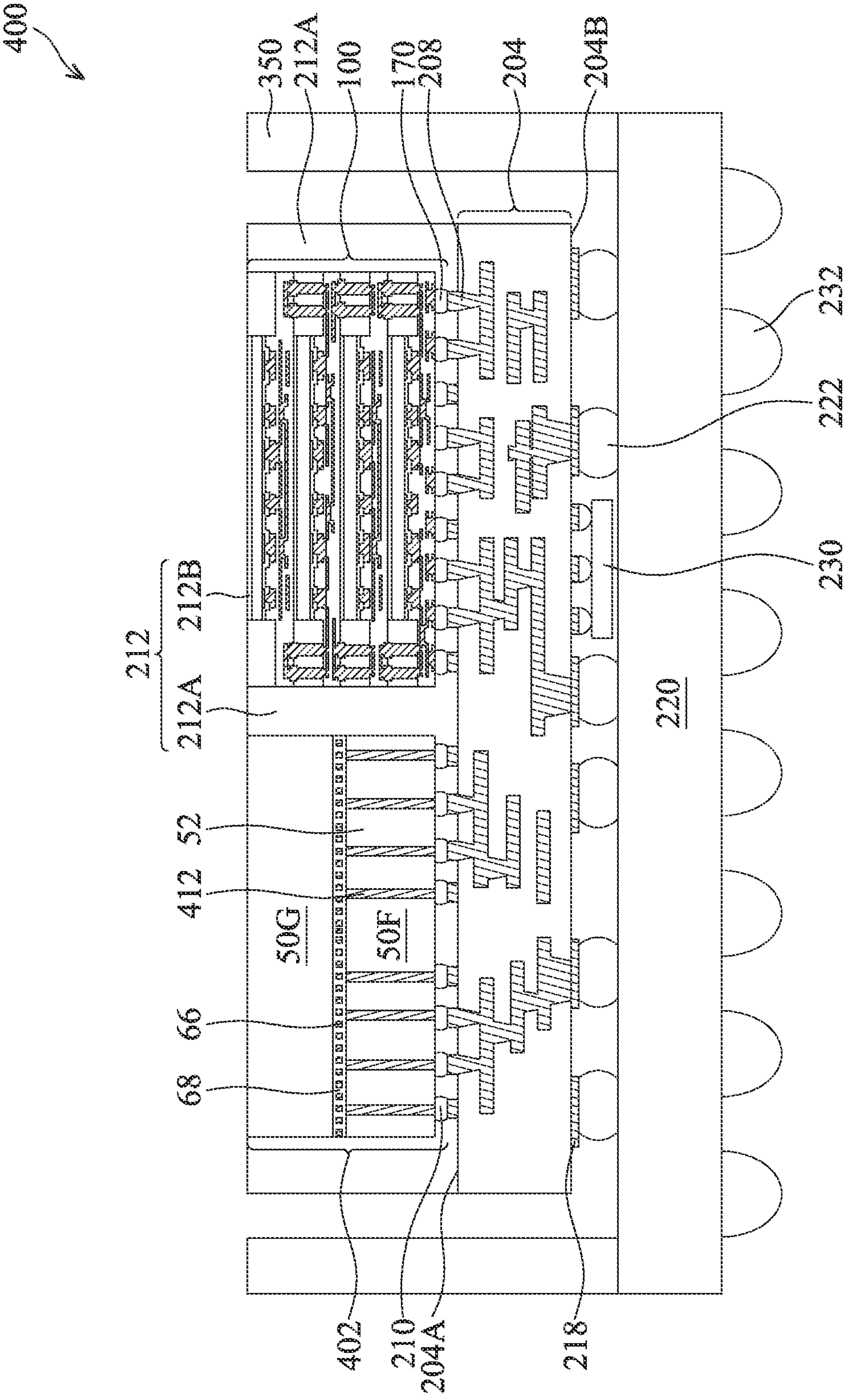
FIG. 20 is a cross-sectional view of an integrated package, in accordance with some embodiments.

In FIG. 20, a cross-sectional view of an integrated package 400 is illustrated in accordance with some embodiments. The integrated package 400 may be similar to the integrated package 200 of FIG. 18, except the integrated package 400 includes one or more semiconductor devices 402 disposed over the redistribution structure 204 (in lieu of the device die 50E). The semiconductor device 402 may have a thickness greater or equal to the semiconductor device 100. For example, the semiconductor device 402 may be a die stack including a device die 50F and a device die 50G stacked over the device die 50F, or a device die similar to the device die 50F or 50G alone and with a thickness greater or equal to the semiconductor device 100 (not separately illustrated). In some embodiments, the device die 50F and the device die 50G may be substantially similar to the integrated circuit die 50 as illustrated in FIG. 1. In some embodiments, the device die 50F is a logic die (e.g., AP or SOC), and the device die 50G is a memory die (e.g., SRAM die or a NAND flash die), or vice versa. In some embodiments, the device die 50F and the device die 50G are both logic dies, where at least one of them may be used for controlling the semiconductor device 100.

In some embodiments, the active surface of the device die 50F and the active surface of the device die 50H face each other. The die connectors 66 of the device dies 50F and 50G may be aligned to and bonded to each other by, for example, an anneal process. The dielectric layers 68 of the device dies 50F and 50G may be aligned to and bonded to each other by, for example, the anneal process. As such, the device dies 50F and 50G are bonded by hybrid bonding (e.g., fusion bonding). In some embodiments, after the hybrid bonding is formed, an interface between the die connectors 66 of the device dies 50F and 50G becomes indistinguishable. In some embodiments, after the hybrid bonding is formed, an interface between the dielectric layers 68 of the device dies 50F and 50G becomes indistinguishable.

In some embodiments, the device die 50F may further include through substrate via 412 (TSV, or alternatively referred to as through silicon via) penetrating through the semiconductor substrate 52 of the device die 50F so as to electrically couple the die connectors 66 to the conductive connectors 210 on a side of the semiconductor substrate 52 opposite to the die connectors 66. As such, the device die 50G may be electrically coupled to the semiconductor device 100 through, for example, the TSVs 412 and the redistribution structure 204. The semiconductor device 402 and the semiconductor device 100 may be encapsulated by the encapsulant 212. The encapsulant 212 includes the first portion that surrounds the semiconductor device 402 and the semiconductor device 100 in accordance with some embodiments.

Figure 21:
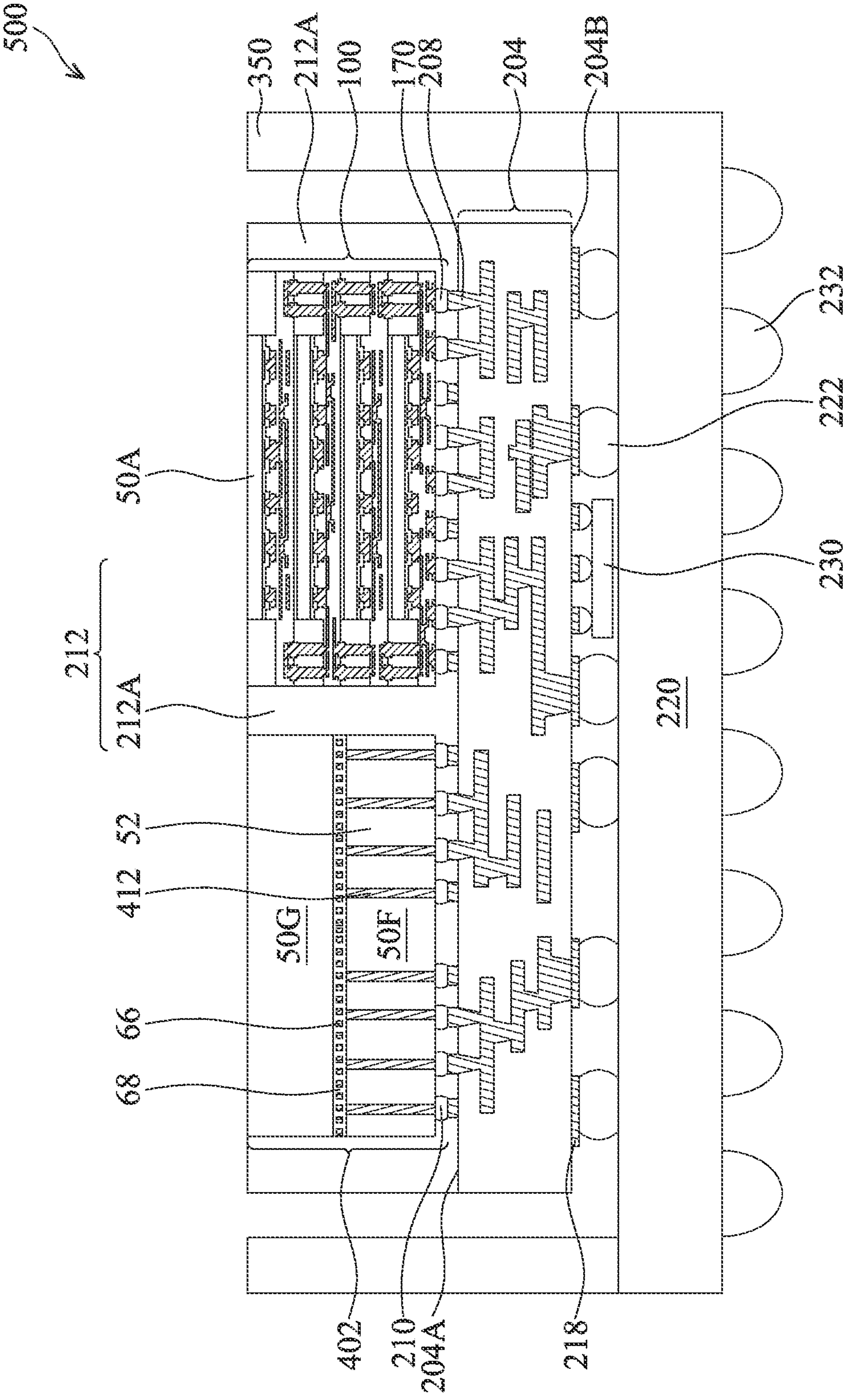
FIG. 21 is a cross-sectional view of an integrated package, in accordance with some embodiments.

In some embodiments in which the semiconductor device 402 has a thickness greater than the semiconductor device 100 when attaching to the redistribution structure 204, a planarization process may be performed to level the top surfaces of the semiconductor device 402 and semiconductor device 100 after the encapsulant 212 is formed (e.g., the processing step described for FIG. 16). Accordingly, the resulting structure of the integrated package 400 as illustrated in FIG. 20, the encapsulant 212, the semiconductor device 402, and the semiconductor device 100 (e.g., the encapsulant 110 of the semiconductor device 100) may have top surfaces level with each other. In some embodiments, the planarization process (e.g., the processing step described for FIG. 16) may be performed until exposing the uppermost device die (e.g., the first device die 50A). In this embodiment, the resulting structure of the integrated package 400 is illustrated in FIG. 21, where the second portion 212B of the encapsulant 212 is removed, and the first device die 50A of the semiconductor device 100 is exposed.

Figure 22:
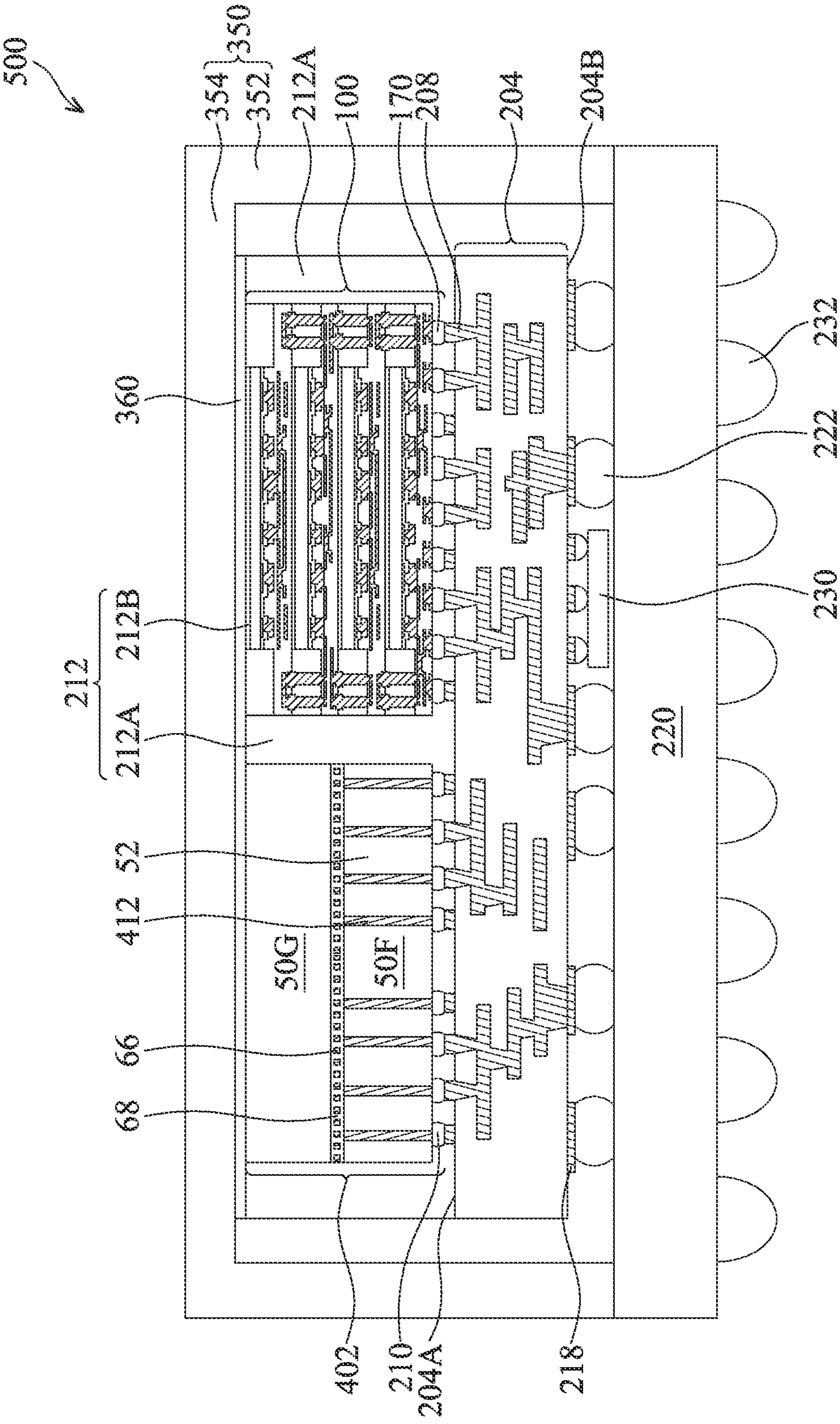
FIG. 22 is a cross-sectional view of an integrated package, in accordance with some embodiments.

In FIG. 22, a cross-sectional view of an integrated package 500 is illustrated in accordance with some embodiments. The integrated package 500 may be similar to the integrated package 300 of FIG. 19, except the integrated package 500 includes one or more semiconductor devices 402 disposed over the redistribution structure 204 (in lieu of the device die 50E). The semiconductor device 402 may be similar to that described for FIG. 20. The heat dissipation structure 350 is disposed over the redistribution structure 204 and surrounds the semiconductor device 402 and the semiconductor device 100. In some embodiments where the semiconductor device

402 is exposed from the top surface of the first portion of the encapsulant 212, the TIM 360 may be in physical contact with the device die 50G.

Figure 23:
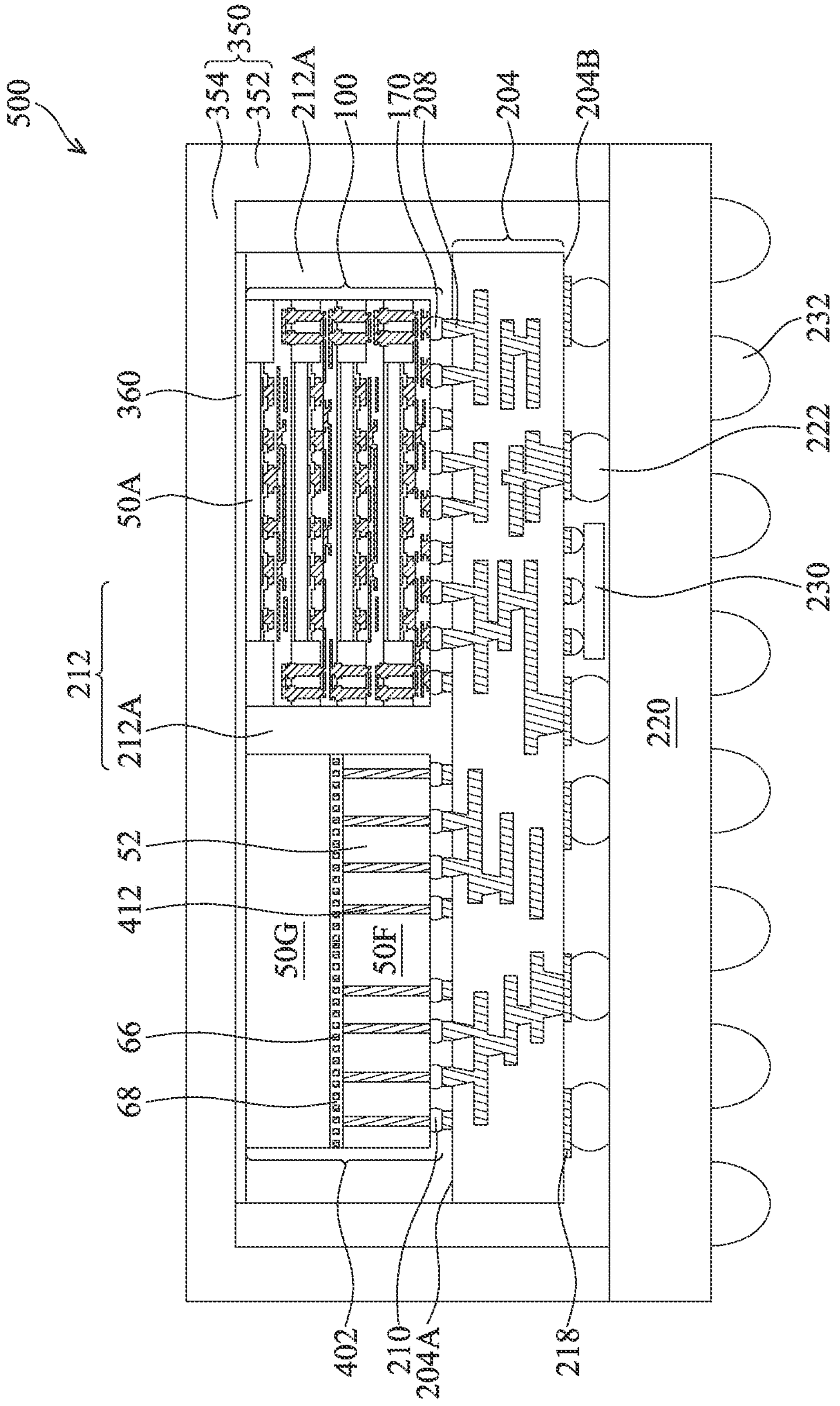
FIG. 23 is a cross-sectional view of an integrated package, in accordance with some embodiments.

In some embodiments in which the semiconductor device 402 has a thickness greater than the semiconductor device 100 when attaching the semiconductor device 402 to the redistribution structure 204, a planarization process may be performed to level the top surfaces of the semiconductor device 402 and semiconductor device 100 after the encapsulant 212 is formed (e.g., the processing step described for FIG. 16). Accordingly, the resulting structure of the integrated package 500 as illustrated in FIG. 22, the encapsulant 212, the semiconductor device 402, and the semiconductor device 100 may have top surfaces level with each other. In some embodiments, the planarization process (e.g., the processing step described for FIG. 16) may be performed until exposing the uppermost semiconductor die (e.g., the first device die 50A). In this embodiment, the resulting structure of the integrated package 500 is illustrated in FIG. 23, where the second portion 212B of the encapsulant 212 is removed, and the first device die 50A of the semiconductor device 100 is in physical contact with the TIM 360.

Figure 24:
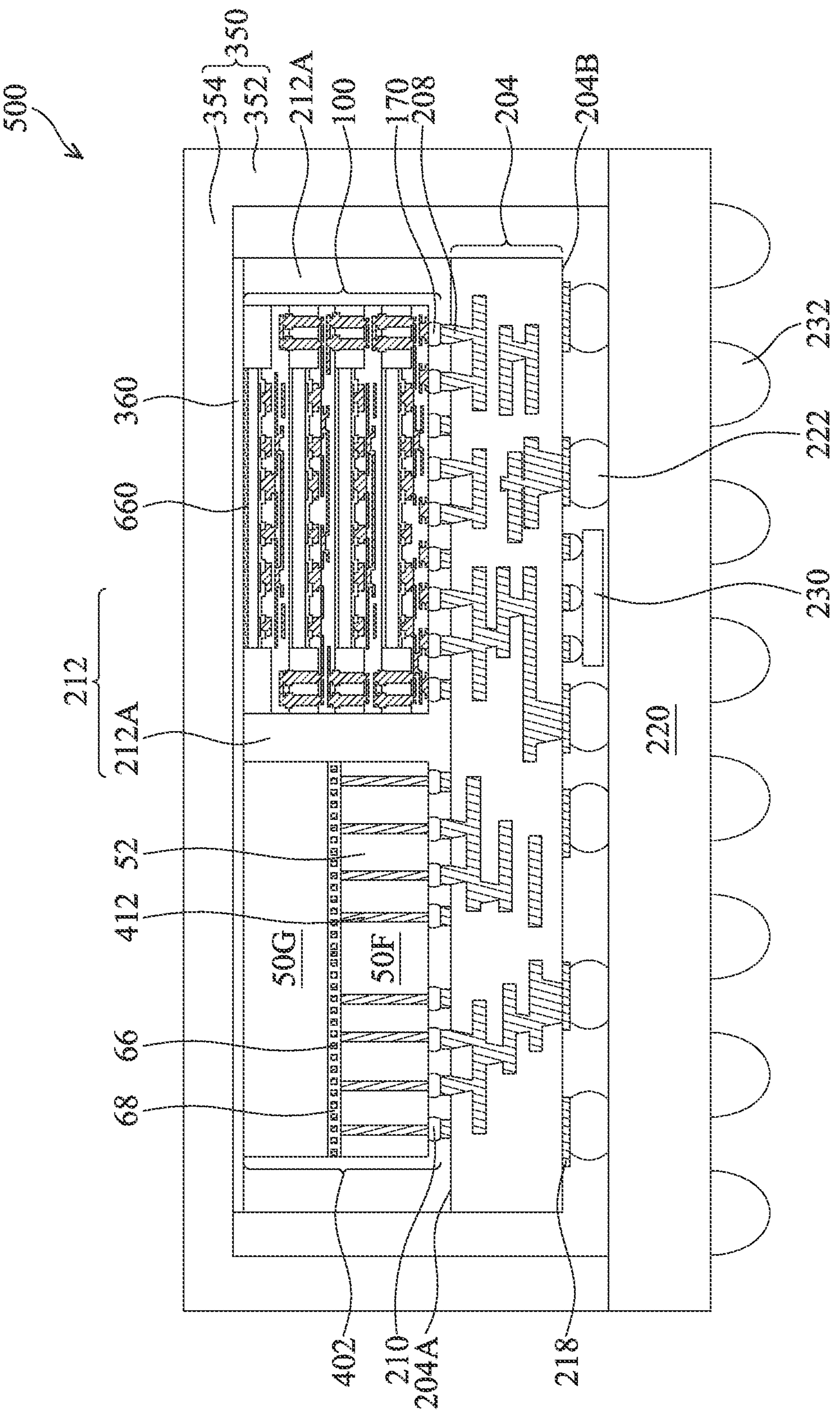
FIG. 24 is a cross-sectional view of an integrated package, in accordance with some embodiments.

In FIG. 24, a cross-sectional view of an integrated package 600 is illustrated in accordance with some embodiments. The integrated package 600 may be similar to the integrated package 500, except the recess 180 is filled with a thermal dissipating material 660 (in lieu of the second portion 212B of the encapsulant 212). For example, the thermal dissipating material 660 may be a metal or a thermal interface material. For example, the thermal dissipating material 660 is deposited or applied to fill the recess 180 before the formation of the encapsulant 212. Excess thermal dissipating material 660 over the encapsulant 110 may be removed together with the encapsulant 212 in the planarizing process of the encapsulant 212. For example, the encapsulant 110 and the thermal dissipating material may be exposed after the planarization process of the encapsulant 212. In some embodiments, the thermal dissipating material 660 has a material similar to that of the TIM 360. In some embodiments, the thermal dissipating material 660 and the TIM 360 are different thermal interface materials. With adding the thermal dissipating material 660 into the recess 180, a better heat dissipating performance of the first to fourth device dies 50A-50D may be achieved.

In accordance with some embodiments, an integrated package comprises a memory package and a logic device integrated over a redistribution structure. The memory package may include multiple fan-out tiers that use TIVs in lieu of TSVs for communication, which may reduce the silicon asset penalty and manufacturing costs. The memory package may include a logic die in one of its fan-out tiers for controlling the memory dies in other fan-out tiers. Alternatively, all the device dies in the memory package are memory dies, and these memory dies may be controlled by the logic device which is independent from the memory package in the integrated package.

In an embodiment, a package includes a first redistribution structure; a first semiconductor device attached to the first redistribution structure; a second semiconductor device attached to the first redistribution structure, wherein the second semiconductor device includes a second redistribution structure; a first device die disposed over the second redistribution structure and including an active surface facing the second redistribution structure; a first encapsulant extending along sidewalls of the first device die; a first through via extending through the first encapsulant; a third redistribution structure disposed over the first encapsulant, the third redistribution structure including a first metallization pattern connecting to the first through via; a second device die disposed over the third redistribution structure, wherein the first device die and the second device die are free of through substrate vias; and a second encapsulant extending along sidewalls of the second device die; and a third encapsulant disposed over the first redistribution structure and surrounding sidewalls of the first semiconductor device and the second semiconductor device, wherein a top surface of the third encapsulant is level with a top surface of the second encapsulant. In an embodiment, a top surface of the second device die is lower than a top surface of the second encapsulant. In an embodiment, the package further includes a fourth encapsulant disposed over the second device die and surrounded by the second encapsulant, wherein the third encapsulant and the fourth encapsulant are a same material. In an embodiment, a top surface of the fourth encapsulant is level with a top surface of the second encapsulant. In an embodiment, a width of the fourth encapsulant is greater than a width of the first device die. In an embodiment, a width of the fourth encapsulant is equal to a width of the first device die. In an embodiment, the package further includes a thermal interface material in physical contact with the second encapsulant, the third encapsulant, and the fourth encapsulant. In an embodiment, each of the first device die and the second device die has an active surface facing the first redistribution structure.

A package includes a first semiconductor device disposed over a first redistribution structure, wherein the first semiconductor device includes a first fan-out tier including a second redistribution structure; a first device die disposed over the second redistribution structure and including an active surface facing the second redistribution structure, wherein the first device die is a first memory die; a first encapsulant extending along sidewalls of the first device die; and a first through via extending through the first encapsulant and connecting to the first encapsulant. The first semiconductor device also includes a second fan-out tier disposed over the first fan-out tier, wherein the second fan-out tier includes a third redistribution structure disposed over the first encapsulant and the first through via; a second device die disposed over the third redistribution structure, wherein the second device die is a second memory die or a first logic die; and a second encapsulant extending along sidewalls of the second device die. The package also includes a second semiconductor device disposed over the first redistribution structure, wherein the second semiconductor device includes a second logic die; and a third encapsulant surrounding sidewalls of the first semiconductor device and the second semiconductor device, wherein a top surface of the third encapsulant is level with a top surface of the second encapsulant, and a top surface of the second device die is lower than the top surface of the third encapsulant. In an embodiment, the third redistribution structure is in physical contact with a top surface of the first encapsulant and a top surface of the first through via. In an embodiment, the package further includes an adhesive layer disposed between a top surface of the first device and the third redistribution structure. In an embodiment, the first encapsulant is free of through vias. In an embodiment, the second semiconductor device includes a die stack, wherein the die stack includes a third device die and a fourth device die, the third device die and the fourth device die being bonded through a hybrid bond. In an embodiment, the package further includes a third fan-out tier disposed between the first fan-out tier and the second fan-out tier, wherein the third fan-out tier includes a fourth redistribution structure disposed over the first encapsulant and the first though via; a third device die disposed over the fourth redistribution structure; a fourth encapsulant extending along sidewalls of the third device die; and a third through via extending through the fourth encapsulant, wherein a top surface of the third device die is lower than a top surface of the third through via. In an embodiment, the package further includes a dissipating structure laterally surrounding the first semiconductor device, the second semiconductor device, and the third encapsulant.

In an embodiment, a method includes attaching a first semiconductor device to a first redistribution structure; attaching a second semiconductor device to the first redistribution structure adjacent the first semiconductor device, wherein the second semiconductor device includes a second redistribution structure; a first device die disposed over the second redistribution structure; a first encapsulant extending along sidewalls of the first device die; and a first through via extending through the first encapsulant; a third redistribution structure over the first encapsulant and the first through via; a second device die disposed over the third redistribution structure; and a second encapsulant extending along sidewalls of the second device die. The method also includes forming a third encapsulant over the first redistribution structure and surrounding sidewalls of the first semiconductor device and the second semiconductor device. In an embodiment, the method further includes forming the second semiconductor device by attaching the second device die to a carrier through a first adhesive layer; forming the second encapsulant along the sidewalls of the second device die and the sidewalls of the first adhesive layer; forming the third redistribution structure over the second device die and the second encapsulant; forming the first through via over the third redistribution structure; attaching the first device die to the third redistribution structure through a second adhesive layer; forming the first encapsulant along the sidewalls of the first device die and the sidewalls of the second adhesive layer and surrounding the first through via; forming the second redistribution structure over the first device die and the first encapsulant; and removing the carrier and the first adhesive layer. In an embodiment, removing the carrier and the first adhesive layer forms a recess surrounded by the first encapsulant, wherein the recess is filled by the third encapsulant. In an embodiment, the method further includes removing a portion of the third encapsulant to separate the third encapsulant to a first portion and a second portion, wherein the first portion of the third encapsulant is surrounded by the first encapsulant. In an embodiment, the method further includes pressing the first device die or the carrier to make the first adhesive layer have a width greater than a width of the first device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:

a first redistribution structure;

a first semiconductor device attached to a first side of the first redistribution structure;

a second semiconductor device attached to the first side of the first redistribution structure, wherein the second semiconductor device comprises:

a second redistribution structure;

a first device die disposed over the second redistribution structure and comprising an active surface facing the second redistribution structure;

a first encapsulant extending along sidewalls of the first device die;

a first through via extending through the first encapsulant;

a third redistribution structure disposed over the first encapsulant, the third redistribution structure comprising a first metallization pattern electrically coupled to the first through via;

a second device die disposed over the third redistribution structure, wherein the first device die and the second device die are free of through substrate vias; and a second encapsulant extending along sidewalls of the second device die; and a third encapsulant disposed over the first redistribution structure and surrounding sidewalls of the first semiconductor device and the second semiconductor device and extending over the topmost surface of the first semiconductor device, wherein a top surface of the third encapsulant is level with a top surface of the second encapsulant, wherein a topmost surface of the first redistribution structure is below or coplanar with a bottommost surface of the third encapsulant.

2. The package of claim 1, wherein the first semiconductor device is laterally spaced apart from the second redistribution structure and the third redistribution structure.

3. The package of claim 2, further comprising a fourth encapsulant disposed over the second device die and surrounded by the second encapsulant, wherein the third encapsulant and the fourth encapsulant are a same material.

4. The package of claim 3, wherein a top surface of the fourth encapsulant is level with a top surface of the second encapsulant.

5. The package of claim 3, wherein a width of the fourth encapsulant is greater than a width of the first device die.

6. The package of claim 3, wherein a width of the fourth encapsulant is equal to a width of the first device die.

7. The package of claim 3, further comprising a thermal interface material in physical contact with the second encapsulant, the third encapsulant, and the fourth encapsulant.

8. The package of claim 1, wherein each of the first device die and the second device die has an active surface facing the first redistribution structure.

9. A package comprising:

a first semiconductor device disposed over a first side of a first redistribution structure, the first semiconductor device being bonded to a first metal layer of the first redistribution structure, wherein the first semiconductor device comprises:

a first fan-out tier comprising:

a second redistribution structure;

a first device die disposed over the second redistribution structure and comprising an active surface facing the second redistribution structure;

a first encapsulant extending along sidewalls of the first device die; and a first through via extending through the first encapsulant and connecting to the second redistribution structure;

a second fan-out tier disposed over the first fan-out tier, wherein the second fan-out tier comprises:

a third redistribution structure disposed over the first encapsulant and the first through via;

a second device die disposed over the third redistribution structure; and a second encapsulant extending along sidewalls of the second device die;

a second semiconductor device disposed over the first side of the first redistribution structure, the second semiconductor device being bonded to the first metal layer of the first redistribution structure, and being laterally spaced apart from the second redistribution structure and the third redistribution structure; and a third encapsulant surrounding sidewalls of the first semiconductor device and the second semiconductor device, wherein a top surface of the third encapsulant is level with a top surface of the second encapsulant, and a top surface of the second device die is lower than the top surface of the third encapsulant.

10. The package of claim 9, wherein the third redistribution structure is in physical contact with a top surface of the first encapsulant and a top surface of the first through via.

11. The package of claim 9, further comprising an adhesive layer disposed between a top surface of the first device die and the third redistribution structure.

12. The package of claim 9, wherein the first device die is free of through vias.

13. The package of claim 9, wherein the second semiconductor device comprises a die stack, wherein the die stack comprises a third device die and a fourth device die, the third device die and the fourth device die being bonded through a hybrid bond.

14. The package of claim 9, further comprising a third fan-out tier disposed between the first fan-out tier and the second fan-out tier, wherein the third fan-out tier comprises:

a fourth redistribution structure disposed over the first encapsulant and the first through via;

a third device die disposed over the fourth redistribution structure;

a fourth encapsulant extending along sidewalls of the third device die; and a third through via extending through the fourth encapsulant, wherein a top surface of the third device die is lower than a top surface of the third through via.

15. The package of claim 9, further comprising a dissipating structure laterally surrounding the first semiconductor device, the second semiconductor device, and the third encapsulant.

16. A package comprising:

a first semiconductor device bonded to a first metal layer of a first redistribution structure;

a second semiconductor device bonded to the first metal layer of the first redistribution structure, wherein the second semiconductor device comprises:

a second redistribution structure;

a first device die disposed over the second redistribution structure;

a first encapsulant extending along sidewalls of the first device die; and a first through via extending through the first encapsulant;

a third redistribution structure over the first encapsulant and the first through via;

a second device die disposed over the third redistribution structure; and a second encapsulant extending along sidewalls of the second device die; and a third encapsulant over the first redistribution structure and surrounding sidewalls of the first semiconductor device and the second semiconductor device, wherein the third encapsulant is free of conductive vias extending therethrough.

17. The package of claim 16, wherein the first device die and the second device die are respectively free of through substrate vias.

18. The package of claim 16, further comprising a third encapsulant over the second device die, the third encapsulant being surrounded by the first encapsulant.

19. The package of claim 16, further comprising an adhesive layer between the second device die and the third redistribution structure.

20. The package of claim 16, wherein the first semiconductor device comprises a stack of semiconductor devices.

* * * * *